United States Patent
Kim et al.

(10) Patent No.: US 12,501,693 B2
(45) Date of Patent: Dec. 16, 2025

(54) SEMICONDUCTOR DEVICE INCLUDING DIFFERENT GATE DIELECTRIC LAYERS AND METHOD FOR MANUFACTURING THE SAME

(71) Applicant: SAMSUNG ELECTRONICS CO., LTD., Suwon-si (KR)

(72) Inventors: Young Mok Kim, Yongin-si (KR); Kyung Lyong Kang, Hwaseong-si (KR); Jun Gu Kang, Hwaseong-si (KR); Yong Sang Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 550 days.

(21) Appl. No.: 17/745,423

(22) Filed: May 16, 2022

(65) Prior Publication Data
US 2023/0077888 A1    Mar. 16, 2023

(30) Foreign Application Priority Data

Sep. 16, 2021   (KR) .................. 10-2021-0123719

(51) Int. Cl.
*H10D 84/83*    (2025.01)
*H10D 64/01*    (2025.01)
(Continued)

(52) U.S. Cl.
CPC .......... *H10D 84/834* (2025.01); *H10D 64/017* (2025.01); *H10D 84/0158* (2025.01); *H10D 84/038* (2025.01)

(58) Field of Classification Search
CPC ... H01L 29/511–513; H01L 21/823462; H01L 21/823412; H01L 21/823418;
(Continued)

(56) References Cited

U.S. PATENT DOCUMENTS 7,425,740 B2   9/2008 Liu et al.
8,815,656 B2   8/2014 Adam et al.
(Continued)

FOREIGN PATENT DOCUMENTS

CN   1945829 A      4/2007
CN   103890930 A    6/2014
(Continued)

OTHER PUBLICATIONS

Communication dated Nov. 11, 2022 issued by the European Patent Office in EP Application No. 22176962.3.
(Continued)

*Primary Examiner* — Eric A. Ward
(74) *Attorney, Agent, or Firm* — Sughrue Mion, PLLC

(57) ABSTRACT

A semiconductor device includes: a substrate including first and second regions thereon; a first active region in the first region; an active pattern protruding from the first active region; a second active region in the second region; a first gate electrode on the active pattern; a second gate electrode on the second active region; a first gate insulating layer, including a first-first insulating layer, between the active pattern and the first gate electrode; and a second gate insulating layer, including a second-first insulating layer and a second-second insulating layer below the second-first insulating layer, between the second active region and the second gate electrode, wherein a thickness in a vertical direction of the first gate electrode that overlaps the active pattern in the vertical direction is equal to a thickness in the vertical direction of the second gate electrode that overlaps the second active region in the vertical direction, and an upper surface of the first gate electrode is formed at a same level as an upper surface of the second gate electrode.

17 Claims, 17 Drawing Sheets

(51) Int. Cl.
  *H10D 84/01* (2025.01)
  *H10D 84/03* (2025.01)
(58) Field of Classification Search
  CPC ..... H01L 21/823431; H01L 21/823437; H01L 27/088; H01L 27/0886; H01L 29/517; H01L 29/518; H01L 29/66545; H01L 29/66795
  See application file for complete search history.

(56) References Cited

U.S. PATENT DOCUMENTS

| | | | |
|---|---|---|---|
| 9,368,502 B2 | 6/2016 | Chang et al. | |
| 9,385,131 B2 | 7/2016 | Beaudoin et al. | |
| 9,431,239 B1 | 8/2016 | Lee et al. | |
| 9,472,572 B2 | 10/2016 | Zang | |
| 9,520,396 B2 | 12/2016 | Singh | |
| 9,570,580 B1 | 2/2017 | Chiang et al. | |
| 9,812,571 B2 | 11/2017 | Doris et al. | |
| 9,985,042 B2 | 5/2018 | Su et al. | |
| 10,128,355 B2 | 11/2018 | Chang et al. | |
| 10,262,870 B2 | 4/2019 | Chen et al. | |
| 10,312,367 B2 | 6/2019 | Phoa et al. | |
| 10,371,583 B1 | 8/2019 | Pan et al. | |
| 10,381,356 B2 | 8/2019 | Zheng et al. | |
| 10,416,216 B2 | 9/2019 | Rogge et al. | |
| 10,522,409 B2 | 12/2019 | Tsai et al. | |
| 10,724,065 B2 | 7/2020 | Lee et al. | |
| 10,840,126 B2 | 11/2020 | Huang et al. | |
| 2010/0270621 A1 | 10/2010 | Iwamoto et al. | |
| 2014/0312404 A1* | 10/2014 | Chou | H10B 41/40 438/153 |
| 2015/0171101 A1 | 6/2015 | Ishida et al. | |
| 2015/0262663 A1 | 9/2015 | Lee et al. | |
| 2016/0071947 A1* | 3/2016 | Wiatr | H10D 84/0144 257/295 |
| 2016/0267979 A1* | 9/2016 | Hong | H10B 41/43 |
| 2016/0358919 A1* | 12/2016 | Chen | H10D 64/025 |
| 2018/0102408 A1 | 4/2018 | Hsiung et al. | |
| 2020/0027964 A1 | 1/2020 | Cheng et al. | |
| 2020/0043939 A1 | 2/2020 | Wu et al. | |
| 2020/0135574 A1 | 4/2020 | Yang et al. | |
| 2020/0211909 A1* | 7/2020 | Tsuda | H10D 84/0135 |
| 2021/0104520 A1 | 4/2021 | Hwang | |
| 2021/0288048 A1* | 9/2021 | Chuang | H01L 21/823462 |
| 2021/0343704 A1* | 11/2021 | Lin | H10D 62/116 |
| 2022/0115508 A1* | 4/2022 | Lin | H01L 29/42364 |

FOREIGN PATENT DOCUMENTS

| | | |
|---|---|---|
| CN | 104051527 A | 9/2014 |
| CN | 104681563 A | 6/2015 |
| CN | 105027291 A | 11/2015 |
| CN | 106486549 A | 3/2017 |
| CN | 107256887 A | 10/2017 |
| CN | 108563801 A | 9/2018 |
| CN | 109196649 A | 1/2019 |
| CN | 112687627 A | 4/2021 |
| CN | 113394274 A | 9/2021 |
| JP | 2010-225993 A | 10/2010 |
| KR | 2001-0063830 A | 7/2001 |
| KR | 10-0350055 B1 | 8/2002 |
| WO | 2013/059010 A1 | 4/2013 |
| WO | 2014/047258 A1 | 3/2014 |
| WO | 2014/089621 A1 | 6/2014 |
| WO | 2014/158198 A1 | 10/2014 |
| WO | 2017/204937 A1 | 11/2017 |
| WO | 2018/156246 A1 | 8/2018 |

OTHER PUBLICATIONS

Communication dated Nov. 23, 2022 issued by the European Patent Office in EP Application No. 22176962.3.

* cited by examiner

SEMICONDUCTOR DEVICE INCLUDING DIFFERENT GATE DIELECTRIC LAYERS AND METHOD FOR MANUFACTURING THE SAME

CROSS-REFERENCE TO RELATED APPLICATION

This application is based on and claims priority from Korean Patent Application No. 10-2021-0123719 filed on Sep. 16, 2021 in the Korean Intellectual Property Office, the disclosure of which is incorporated herein in its entirety by reference.

BACKGROUND

1. Field

The present disclosure relates to a semiconductor device and a method for manufacturing the same.

2. Description of the Related Art

Although a voltage decreases with miniaturization of semiconductor elements, there are cases where a booster circuit is provided inside or a power supply voltage itself is about 12V, of which an example is a vehicle application. In order to cope with such application, it is generally performed to form a high voltage transistor together with a low voltage transistor inside one same semiconductor element. In the process of forming the low voltage transistor and the high voltage transistor inside the same semiconductor element, there is a problem that heights of gate electrodes are formed non-uniformly.

SUMMARY

Various embodiments of the present disclosure provide a semiconductor device and a method for manufacturing a semiconductor that may enable a low voltage transistor, an intermediate voltage transistor, and a high voltage transistor formed on a same substrate to have respective gate electrodes having a same thickness and respective gate insulating layers having different thicknesses, thereby to be formed at a same level on the substrate.

According to an embodiment, there is provided a semiconductor device that may include: a substrate including first and second regions thereon; a first active region in the first region; an active pattern protruding from the first active region; a second active region in the second region; a first gate electrode on the active pattern; a second gate electrode on the second active region; a first gate insulating layer, including a first-first insulating layer, between the active pattern and the first gate electrode; and a second gate insulating layer, including a second-first insulating layer and a second-second insulating layer below the second-first insulating layer, between the second active region and the second gate electrode, wherein a thickness in a vertical direction of the first gate electrode that overlaps the active pattern in the vertical direction is equal to a thickness in the vertical direction of the second gate electrode that overlaps the second active region in the vertical direction, and an upper surface of the first gate electrode is formed at a same level as an upper surface of the second gate electrode.

According to an exemplary embodiment, there is provided a semiconductor device that may include: a substrate including first to third regions thereon; a first active region in the first region; an active pattern protruding from the first active region; a second active region in the second region; a third active region in the third region; a first gate electrode on the active pattern; a second gate electrode on the second active region; a third gate electrode on the third active region; a first gate insulating layer, including a first-first insulating layer, between the active pattern and the first gate electrode; and a second gate insulating layer, including a second-first insulating layer and a second-second insulating layer below the second-first insulating layer, between the second active region and the second gate electrode; and a third gate insulating layer, including a third-first insulating layer, a third-second insulating layer below the third-first insulating layer, and a third-third insulating layer below the third-second insulating layer, between the third active region and the third gate electrode, wherein a thickness in a vertical direction of the first gate electrode that overlaps the active pattern in the vertical direction, a thickness in the vertical direction of the second gate electrode that overlaps the second active region in the vertical direction, and a thickness in the vertical direction of the third gate electrode that overlaps the third active region in the vertical direction are equal to one another, and wherein an upper surface of the first gate electrode, an upper surface of the second gate electrode, and an upper surface of the third gate electrode are formed at a same level on the substrate.

According to an exemplary embodiment, there is provided a method for fabricating a semiconductor device. The method may include: providing a substrate including first to third regions thereon; etching an upper surface of the substrate at the second region to form a first trench, and etching the upper surface of the substrate at the third region to form a second trench; forming a first insulating material layer inside each of the first and second trenches; etching the substrate at the first region to form an active pattern; etching the substrate at each of the first to third regions to form first to third active regions; etching at least a part of the first insulating material layer formed on the third active region; forming a second insulating material layer on the third active region; etching the first insulating material layer formed on the second active region; forming a third insulating material layer on each of the second active region and the second insulating material layer of the third active region; forming an insulating layer on each of the active pattern, the third insulating material layer formed on the second active region, and the third insulating material layer formed on the third active region; and forming a first gate electrode on the insulating layer on the active pattern, forming a second gate electrode on the insulating layer on the second active region, and forming a third gate electrode on the insulating layer on the third active region, wherein a thickness in a vertical direction of the first gate electrode that overlaps the active pattern in the vertical direction, a thickness in the vertical direction of the second gate electrode that overlaps the second active region in the vertical direction, and a thickness in the vertical direction of the third gate electrode that overlaps the third active region in the vertical direction are equal to one another, and wherein an upper surface of the first gate electrode, an upper surface of the second gate electrode, and an upper surface of the third gate electrode are formed at a same level.

However, aspects are not restricted to the one set forth herein. The above and other aspects will become more apparent to one of ordinary skill in the art to which the present disclosure pertains by referencing the detailed description given below.

BRIEF DESCRIPTION OF DRAWINGS

The above and other aspects and features of the present disclosure will become more apparent by describing in detail exemplary embodiments thereof referring to the attached drawings, in which.

DETAILED DESCRIPTION

The embodiments described herein are example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

It will be understood that, although the terms first, second, third, fourth, first-first, first-second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Although drawings of a semiconductor device according to some embodiments illustrate a fin-type transistor (FinFET) having a channel region of a fin-type pattern shape as an example, the present disclosure is not limited thereto. In some other embodiments, the corresponding semiconductor device may include a MBCFET (Multi-Bridge Channel Field Effect Transistor) having nanosheets as its channel region.

Hereinafter, a semiconductor device according to embodiments will be described referring to FIGS. 1 and 2.

Figure 1:
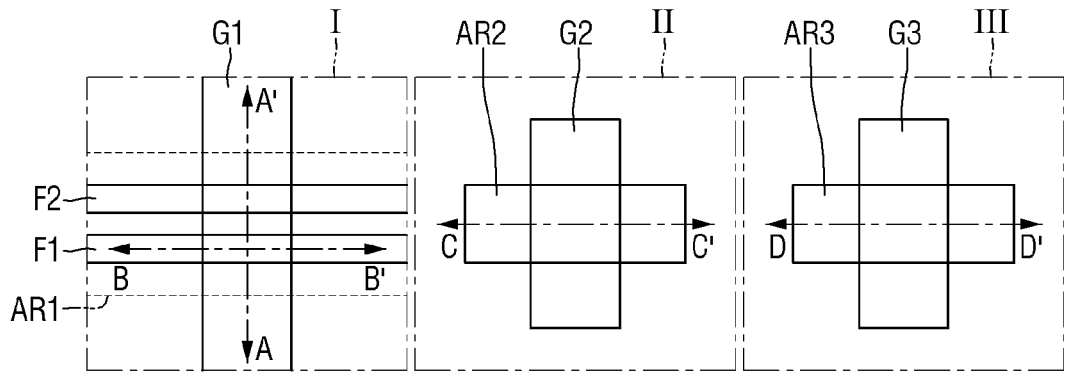
FIG. 1 is a schematic layout diagram for explaining a semiconductor device according to embodiments.
Figure 1:
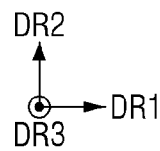

FIG. 1 is a schematic layout diagram for explaining a semiconductor device, according to some embodiments. FIG. 2 is a cross-sectional view taken along each of line A-A', line B-B', line C-C' and line D-D' of FIG. 1.

Figure 2:
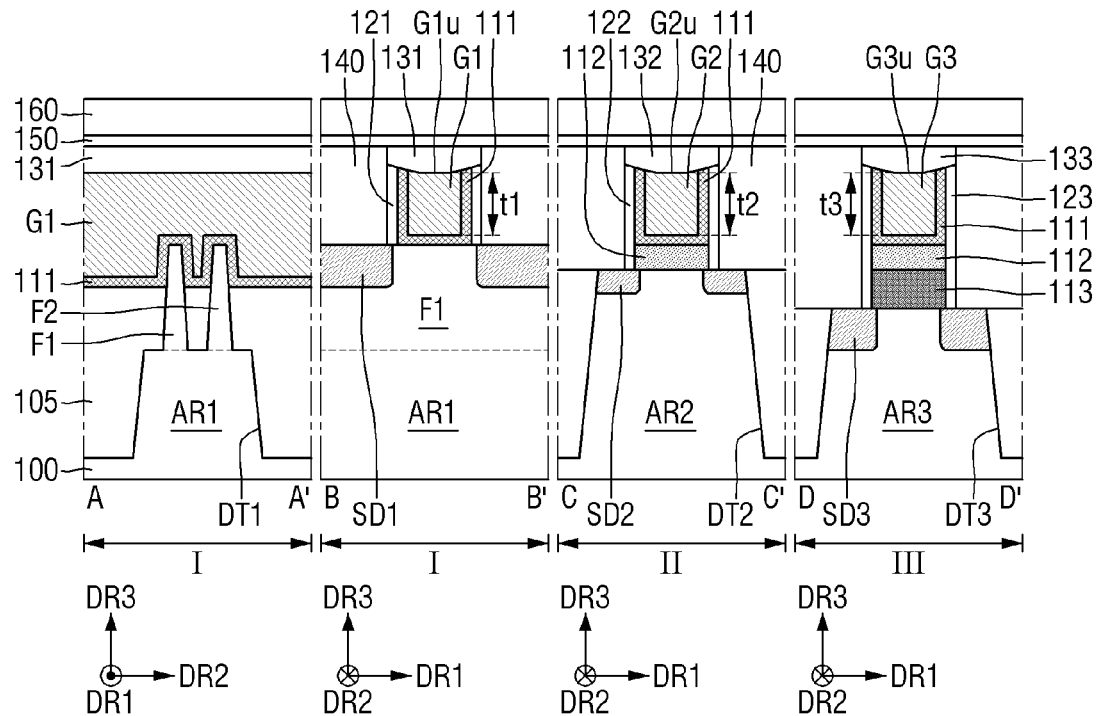
FIG. 2 is a cross-sectional view taken along each of line A-A', line B-B', line C-C' and line D-D' of FIG. 1.

Referring to FIGS. 1 and 2, the semiconductor device according to embodiments includes a substrate 100, a field insulating layer 105, first to third gate electrodes G1, G2 and G3, first to third gate insulating layers, first to third gate spacers 121, 122 and 123, first to third capping patterns 131, 132 and 133, first to third source/drain regions SD1, SD2 and SD3, a first interlayer insulating layer 140, an etching stop layer 150, and a second interlayer insulating layer 160.

The substrate 100 may be a silicon substrate or an SOI (silicon-on-insulator). In contrast, the substrate 100 may include, but is not limited to, silicon germanium, SGOI (silicon germanium on insulator), indium antimonide, lead tellurium compounds, indium arsenic, indium phosphide, gallium arsenide or gallium antimonide. However, the present disclosure is not limited thereto.

First to third regions I, II and III may be defined on the substrate 100. According to an embodiment, a low voltage transistor may be disposed on the substrate 100 at the first region I, an intermediate voltage transistor may be disposed on the substrate 100 at the second region II, and a high voltage transistor may be disposed on the substrate 100 at the third region III.

Each of first to third active regions AR1, AR2, and AR3 may extend in a first horizontal direction DR1 on the substrate 100. Each of the first to third active regions AR1, AR2, and AR3 may protrude from the substrate 100 in a vertical direction DR3. Each of the first to third active regions AR1, AR2, and AR3 may be a part of the substrate 100, or may be or may include an epitaxial layer that is grown from the substrate 100.

The first active region AR1 may be disposed in the first region I, the second active region AR2 may be disposed on the second region II, and the third active region AR3 may be disposed in the third region III. The first active region AR1 may be defined by a first deep trench DT1 formed in the first region I. The second active region AR2 may be defined by a second deep trench DT2 formed in the second region II. The third active region AR3 may be defined by a third deep trench DT3 formed in the third region III.

First and second active patterns F1 and F2 may be formed to extend in the first horizontal direction DR1 on the first active region AR1. Each of the first and second active patterns F1 and F2 may protrude from the first active region AR1 in the vertical direction DR3. The second active pattern F2 may be spaced apart from the first active pattern F1 in a second horizontal direction DR2 different from the first horizontal direction DR1. Each of the first and second active patterns F1 and F2 may function as a channel structure of a corresponding transistor formed in the first region I.

According to an embodiment, an upper surface of the second active region AR2 may be formed at a level lower than an upper surface of a first active pattern F1. The upper surface of the second active region AR2 may be formed at a level between the upper surface of the first active region AR1 and the upper surface of the first active pattern F1. An upper surface of the third active region AR3 may be formed at a level lower than the upper surface of the second active region AR2. Upper portions of the second and third active regions AR2 and AR3 may function as channel structures of corresponding transistors formed in the second and third regions II and III, respectively.

The field insulating layer 105 may be disposed on the substrate 100. The field insulating layer 105 may surround side walls of each of the first to third active regions AR1, AR2, and AR3. The field insulating layer 105 may surround side walls of each of the first and second active patterns F1 and F2. Each of the first and second active patterns F1 and F2 may protrude above a level of an upper surface of the field insulating layer 105 in the vertical direction DR3. The field insulating layer 105 may include, for example, an oxide film, a nitride film, an oxynitride film or a combination film thereof.

A first gate electrode G1 may extend in a second horizontal direction DR2 on the first active region AR1. The first gate electrode G1 may be disposed on the first and second active patterns F1 and F2. A second gate electrode G2 may extend in the second horizontal direction DR2 on the second active region AR2. A third gate electrode G3 may extend in the second horizontal direction DR2 on the third active region AR3.

Thicknesses of the first to third gate electrodes G1, G2, and G3 in the vertical direction DR3 may be equal to one another. For example, a first thickness t1 in the vertical direction DR3 of the first gate electrode G1 that overlaps the first active pattern F1 in the vertical direction DR3, a second thickness t2 in the vertical direction DR3 of the second gate electrode G2 that overlaps the second active region AR2 in the vertical direction DR3, and a third thickness t3 in the vertical direction DR3 of the third gate electrode G3 that overlaps the third active region AR3 in the vertical direction DR3 may be equal to one another.

Upper surfaces of the first to third gate electrodes G1, G2, and G3 may be formed at a same level on the substrate 100. For example, an upper surface G1u of the first gate electrode G1 that is in contact with a bottom surface of a first capping pattern 131, an upper surface G2u of the second gate electrode G2 that is in contact with a bottom surface of a second capping pattern 132, and an upper surface G3u of the third gate electrode G3 that is in contact with a bottom surface of a third capping pattern 133 may be formed at a same level on the substrate 100.

Each of the first to third gate electrodes G1, G2, and G3 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first to third gate electrodes G1, G2, and G3 may include a conductive metal oxide, a conductive metal oxynitride, and the like, and may include a form in which the above-mentioned substance is oxidized.

A first source/drain region SD1 may be disposed on at least one side of the first gate electrode G1. The first source/drain region SD1 may be disposed on each of the first and second active patterns F1 and F2. A second source/drain region SD2 may be disposed on at least one side of the second gate electrode G2. The second source/drain region SD2 may be disposed on the second active region AR2. A third source/drain region SD3 may be disposed on at least one side of the third gate electrode G3. The third source/drain region SD3 may be disposed on the third active region AR3.

According to an embodiment, an upper surface of the second source/drain region SD2 may be formed at a level lower than the upper surface of the first source/drain region SD1. An upper surface of the third source/drain region SD3 may be formed at a level lower than the upper surface of the second source/drain region SD2. According to an embodiment, a thickness of the third source/drain region SD3 in the vertical direction DR3 may be greater than a thickness of the second source/drain region SD2 in the vertical direction DR3.

A first gate spacer 121 may extend in the second horizontal direction DR2 along both side walls of the first gate electrode G1. A second gate spacer 122 may extend in the second horizontal direction DR2 along both side walls of the second gate electrode G2. A third gate spacer 123 may extend in the second horizontal direction DR2 along both side walls of the third gate electrode G3.

Each of the first to third gate spacers 121, 122 and 123 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

In the first region I, the first gate insulating layer 111 may include a first insulating layer 111. The first gate insulating layer 111 may be formed of a single film including the first insulating layer 111. The first gate insulating layer 111 may be disposed between the first gate spacers 121.

In the first region I, the first insulating layer 111 may be disposed along side walls and a bottom surface of the first gate electrode G1. According to an embodiment, the first insulating layer 111 may be disposed between the first active pattern F1 and the first gate electrode G1. The first insulating layer 111 may be disposed between the field insulating layer 105 and the first gate electrode G1. The first insulating layer 111 may be disposed between the first gate spacer 121 and the first gate electrode G1.

In the second region II, the second gate insulating layers 111 and 112 may include a second insulating layer 112 and the first insulating layer 111 disposed on the second insulating layer 112. The first insulating layer 111 may be disposed along side walls and a bottom surface of the second gate electrode G2. The second gate insulating layers 111 and 112 may be disposed between the second gate spacers 122.

According to an embodiment, in the second region II, the first insulating layer 111 may be disposed between the second active region AR2 and the second gate electrode G2. The first insulating layer 111 may be disposed between the second gate spacer 122 and the second gate electrode G2. According to an embodiment, the second insulating layer 112 may be disposed between the second active region AR2 and the first insulating layer 111.

According to an embodiment, in the second region II, a width of the second insulating layer 112 in the first horizontal direction DR1 may be equal to a width of the first insulating layer 111 in the first horizontal direction DR1. According to an embodiment, a thickness of the second insulating layer 112 in the vertical direction DR3 may be greater than a thickness of the first insulating layer 111 in the vertical direction DR3.

In the third region III, the third gate insulating layers 111, 112 and 113 may include a first insulating layer 111, a second insulating layer 112, and a third insulating layer 113. The first insulating layer 111 may be disposed along side walls and a bottom surface of the third gate electrode G3. The third gate insulating layers 111, 112 and 113 may be disposed between the third gate spacers 123.

According to an embodiment, in the third region III, the first insulating layer 111 may be disposed between the third active region AR3 and the third gate electrode G3. The first insulating layer 111 may be disposed between the third gate spacer 123 and the third gate electrode G3. According to an embodiment, the second insulating layer 112 may be disposed between the third active region AR3 and the first insulating layer 111. According to an embodiment, the third insulating layer 113 may be disposed between the third active region AR3 and the second insulating layer 112.

According to an embodiment, a width of the third insulating layer 113 in the first horizontal direction DR1 may be equal to each of a width of the second insulating layer 112 in the first horizontal direction DR1 and a width of the first insulating layer 111 in the first horizontal direction DR1. According to an embodiment, a thickness of the third insulating layer 113 in the vertical direction DR3 may be greater than a thickness of the second insulating layer 112 in the vertical direction DR3.

The first insulating layer 111 may include, for example, at least one of silicon oxide ($SiO_2$), silicon oxynitride (SiON), silicon nitride (SiN) and a high dielectric constant material having a dielectric constant greater than that of silicon oxide ($SiO_2$). The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

Each of the second insulating layer 112 and the third insulating layer 113 may include, for example, silicon oxide ($SiO_2$). In some other embodiments, each of the second insulating layer 112 and the third insulating layer 113 may include silicon oxynitride (SiON), silicon nitride (SiN), or a high dielectric constant material having a higher dielectric constant than silicon oxide ($SiO_2$).

The first capping pattern 131 may be disposed on the first gate electrode G1, the first insulating layer 111, and the first gate spacer 121. The first capping pattern 131 may extend in the second horizontal direction DR2. The second capping pattern 132 may be disposed on the second gate electrode G2, the first insulating layer 111, and the second gate spacer 122. The second capping pattern 132 may extend in the second horizontal direction DR2. The third capping pattern 133 may be disposed on the third gate electrode G3, the first insulating layer 111, and the third gate spacer 123. The third capping pattern 133 may extend in the second horizontal direction DR2.

Each of the first to third capping patterns 131, 132 and 133 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

The first interlayer insulating layer 140 may be disposed on the field insulating layer 105. The first interlayer insulating layer 140 may be disposed on each of the first to third source/drain regions SD1, SD2 and SD3, and the first to third gate spacers 121, 122 and 123. According to an embodiment, an upper surface of the first interlayer insulating layer 140 may be formed at a same level as upper surfaces of the first to third capping patterns 131, 132 and 133 on the substrate 100.

The first interlayer insulating layer 140 may include, for example, at least one of silicon oxide, silicon nitride, silicon oxycarbide, silicon oxynitride, silicon oxycarbonitride, and a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the present disclosure is not limited thereto.

An etching stop layer 150 may be disposed on each of the first interlayer insulating layer 140 and the first to third capping patterns 131, 132 and 133. Although FIG. 2 shows that the etching stop layer 150 is formed as a single film, the present disclosure is not limited thereto. In some other embodiments, the etching stop layer 150 may be formed as multiple films. The etching stop layer 150 may include, for example, at least one of silicon oxide, silicon nitride, silicon oxynitride, and a low dielectric constant material.

The second interlayer insulating layer 160 may be disposed on the etching stop layer 150. The second interlayer insulating layer 160 may include, for example, at least one of a silicon oxide, a silicon nitride, a silicon oxynitride, and a low dielectric constant material.

Hereinafter, a method for fabricating a semiconductor device according to some embodiments will be described referring to FIGS. 2 to 20.

FIGS. 3 to 20 are intermediate stage diagrams for explaining the method for fabricating the semiconductor device shown in FIGS. 1 and 2, according to embodiments.

Figure 3:
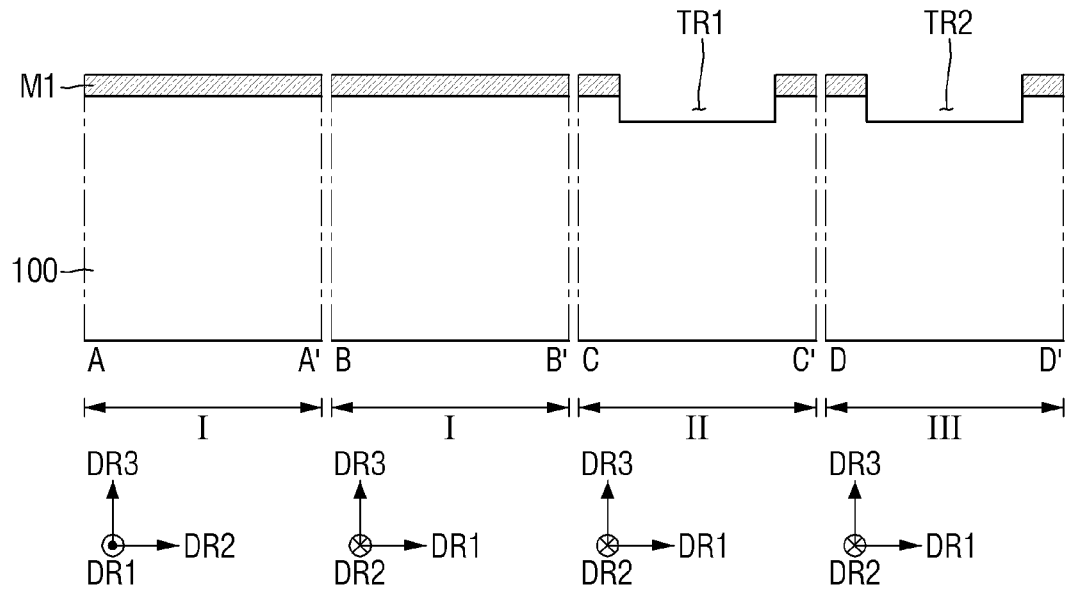
FIGS. 3 to 20 are intermediate stage diagrams for explaining a method for fabricating a semiconductor device, according to embodiments.

Referring to FIG. 3, a substrate 100 in which first to third regions I, II and III are defined may be provided. Subsequently, a first mask pattern M1 may be formed on an upper surface of the substrate 100. Subsequently, a first trench TR1 may be formed, by etching the upper surface of the substrate 100 at the second region II, using the first mask pattern M1 as a mask. Further, a second trench TR2 may be formed, by etching the upper surface of the substrate 100 at the third region III, using the first mask pattern M1 as a mask. According to an embodiment, the first trench TR1 and the second trench TR2 may be formed to have an equal depth. That is, a lower surface of the first trench TR1 and a lower surface of the second trench TR2 may be formed at a same level on the substrate 100.

Figure 4:
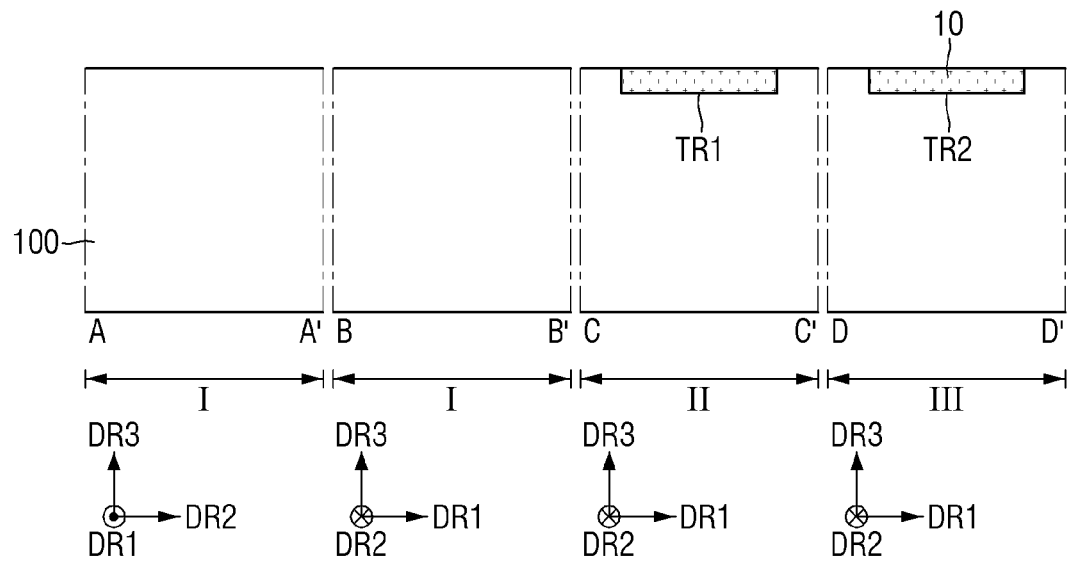

Referring to FIG. 4, a first insulating material layer 10 may be formed inside each of the first trench TR1 and the second trench TR2. The first insulating material layer 10 may include, for example, silicon oxide ($SiO_2$). After that, the first mask pattern M1 may be removed through a flattening process. As a result, the upper surface of the substrate 100 and an upper surface of the first insulating material layer 10 may be coplanar.

Figure 5:
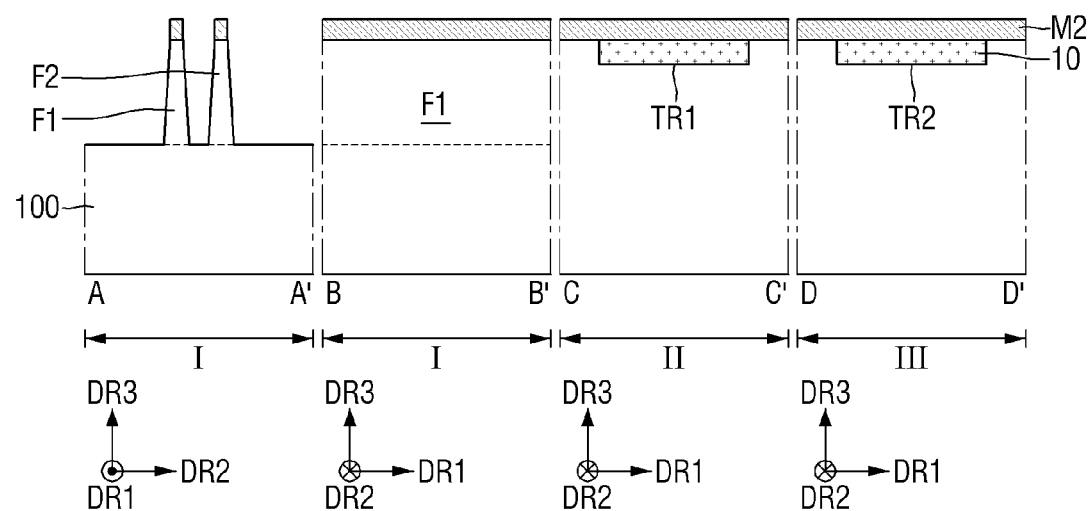

Referring to FIG. 5, a second mask pattern M2 may be formed on the upper surface of the substrate 100 and the first insulating material layer 10. Subsequently, by etching a part of the substrate 100 at the first region I using the second mask pattern M2 as a mask, the first and second active patterns F1 and F2 extending in the first horizontal direction DR1 may be formed.

Figure 6:
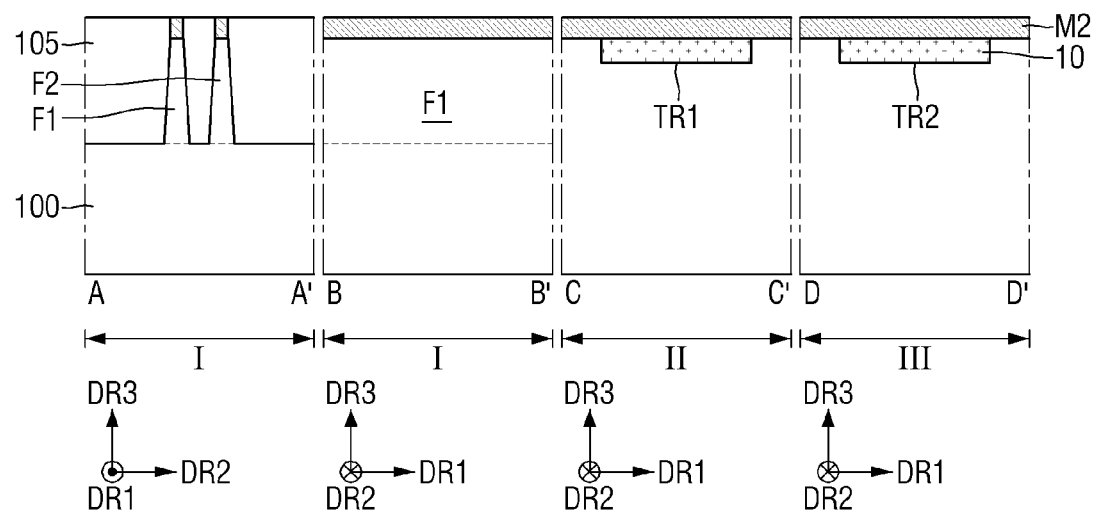

Referring to FIG. 6, the field insulating layer 105 may be formed to surround the side walls of each of the first and second active patterns F1 and F2 and side walls of the second mask pattern M2. According to an embodiment, an upper surface of the field insulating layer 105 may be formed on a same plane as an upper surface of the second mask pattern M2.

Figure 7:
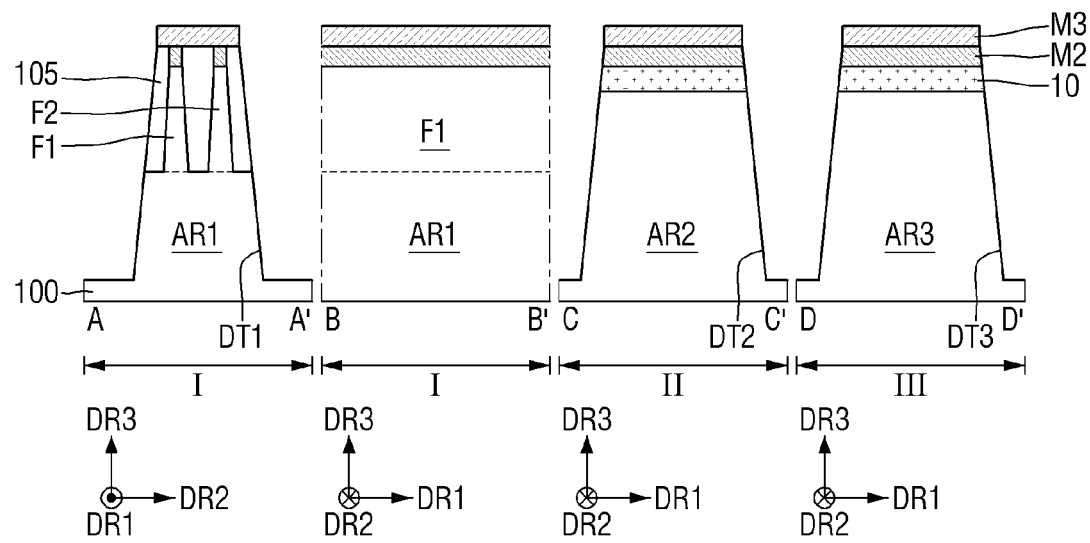

Referring to FIG. 7, a third mask pattern M3 may be formed on the field insulating layer 105 and the second mask pattern M2. Subsequently, a part of the second mask pattern M2, a part of the first insulating material layer 10, a part of the field insulating layer 105, and a part of the substrate 100 may be etched, using the third mask pattern M3 as a mask. Through this etching process, the first deep trench DT1 may be formed on the substrate 100 at the first region I, the second deep trench DT2 may be formed on the substrate 100 at the second region II, and the third deep trench DT3 may be formed on the substrate 100 at the third region III.

As a result, the first active region AR1 defined by the first deep trench DT1 may be formed on the substrate 100 at the first region I, the second active region AR2 defined by the second deep trench DT2 may be formed on the substrate 100 at the second region II, and the third active region AR3 defined by the third deep trench DT3 may be formed on the substrate 100 at the third region III. Each of the first to third active regions AR1, AR2, and AR3 may extend in the first horizontal direction DR1.

Figure 8:
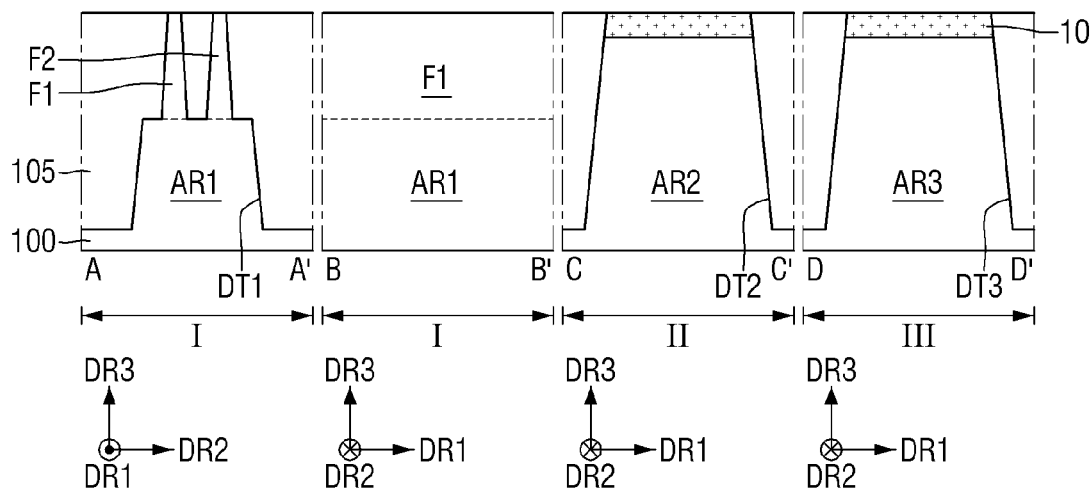

Referring to FIG. 8, the field insulating layer 105 may be further formed inside each of the first to third deep trenches DT1, DR2, and DR3. Subsequently, the third mask pattern M3 and the second mask pattern M2 may be removed through a flattening process. As a result, upper surfaces of each of the first and second active patterns F1 and F2, the upper surface of the field insulating layer 105, and the upper surface of the first insulating material layer 10 may be formed at a same level on the substrate 100.

Figure 9:
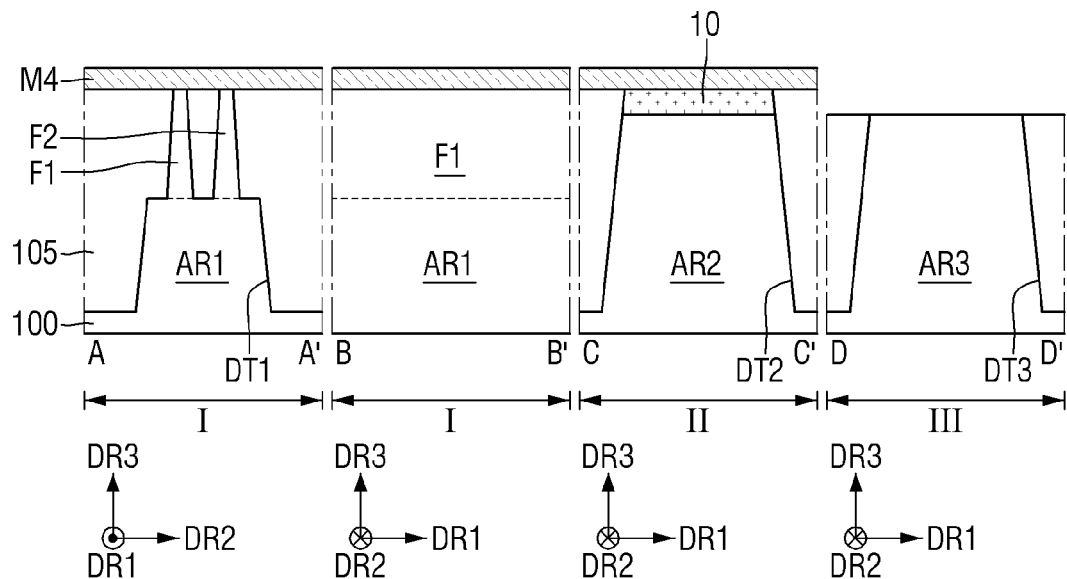

Referring to FIG. 9, a fourth mask pattern M4 may be formed in the first region I and the second region II. Subsequently, a part of the field insulating layer 105 formed in the third region III and the first insulating material layer 10 may be etched using the fourth mask pattern M4 as a mask. For example, the first insulating material layer 10 formed in the third region III may be completely etched.

Figure 10:
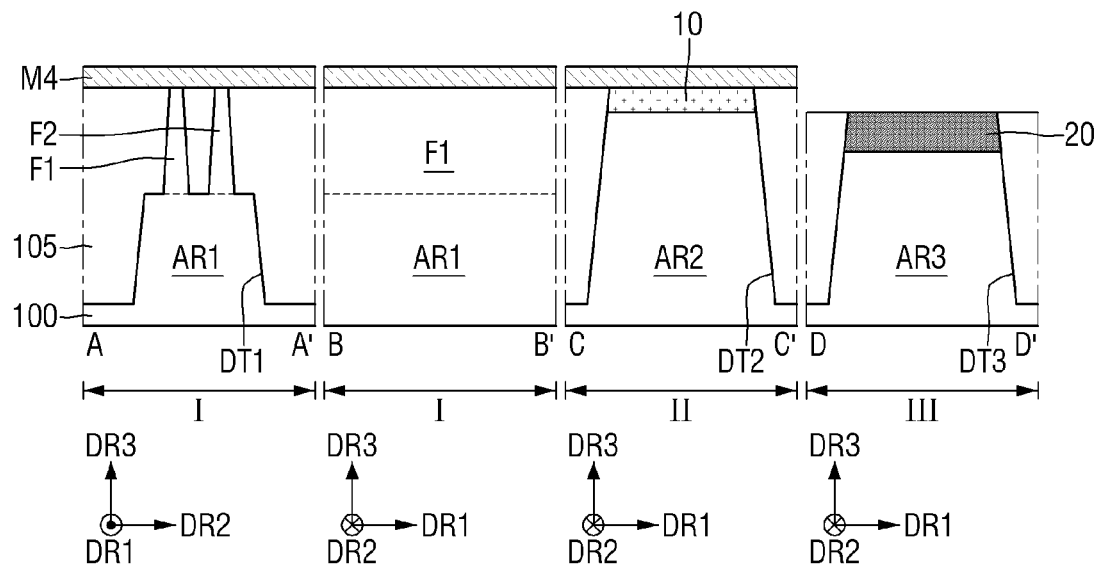

Referring to FIG. 10, the second insulating material layer 20 may be formed on the third active region AR3. According to an embodiment, a part of an upper part of the third active region AR3 may be oxidized to form the second insulating material layer 20. The second insulating material layer 20 may include, for example, a silicon oxide ($SiO_2$).

Figure 11:
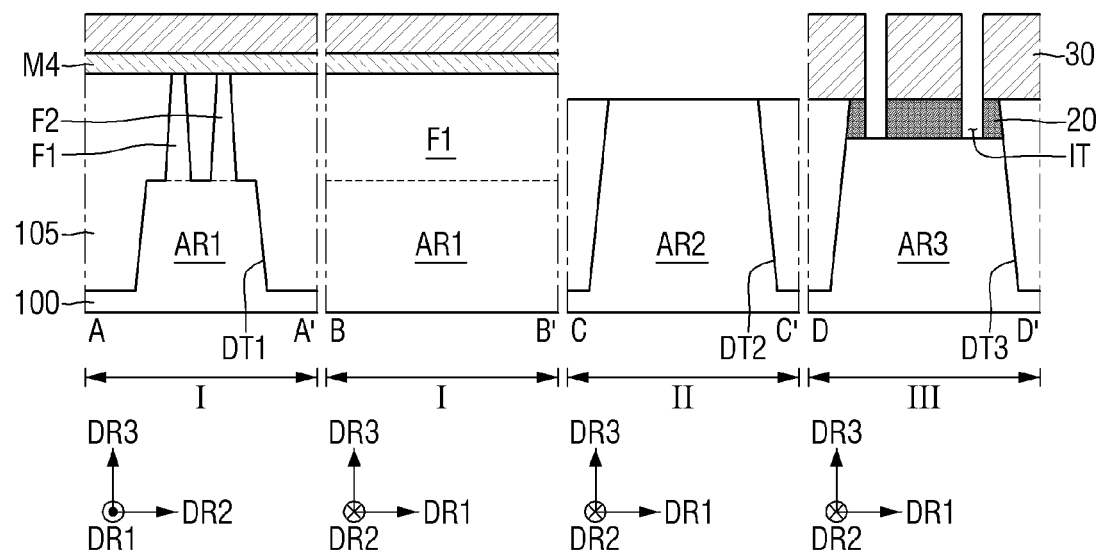

Referring to FIG. 11, a first protective layer 30 may be formed in the first region I and the third region III. The first protective layer 30 may expose a part of the second insulating material layer 20 formed in the third region III.

Subsequently, the fourth mask pattern M4, a part of the field insulating layer 105, and the first insulating material layer 10 formed in the second region II may be etched, using the first protective layer 30 as a mask. For example, the first insulating material layer 10 formed in the second region II may be completely etched. Further, an implant trench IT may be formed by etching a part of the second insulating material layer 20 exposed in the third region III using the first protective layer 30 as a mask. The upper surface of the third active region AR3 may be exposed through the implant trench IT.

Figure 12:
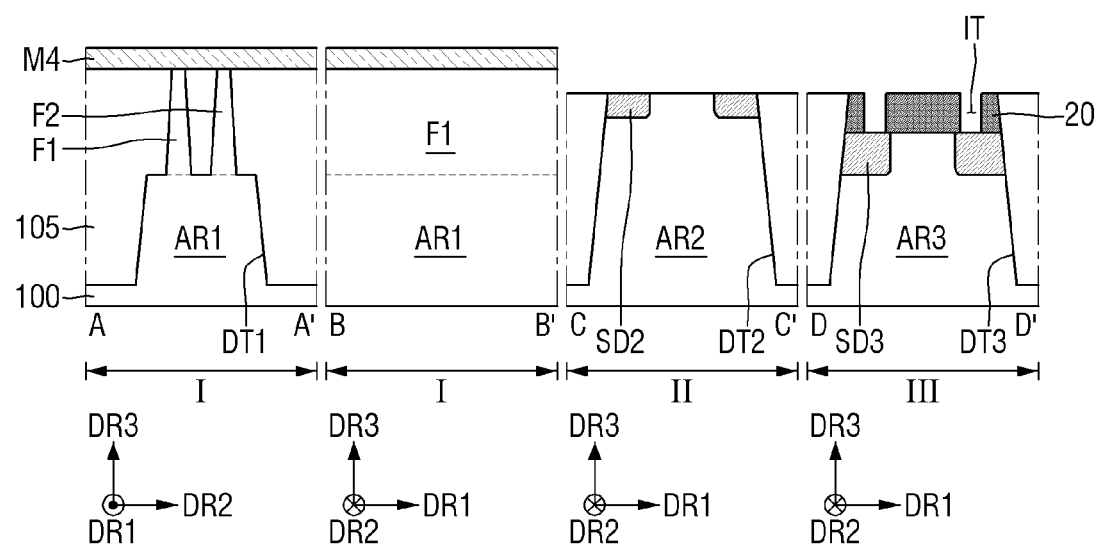

Referring to FIG. 12, a second source/drain region SD2 may be formed in the second active region AR2. Further, a third source/drain region SD3 may be formed in the third active region AR3 through the implant trench IT. Subsequently, the first protective layer 30 may be removed. According to an embodiment, a thickness of the third source/drain region SD3 in the vertical direction DR3 may be formed to be greater than a thickness of the second source/drain region SD2 in the vertical direction DR3.

Figure 13:
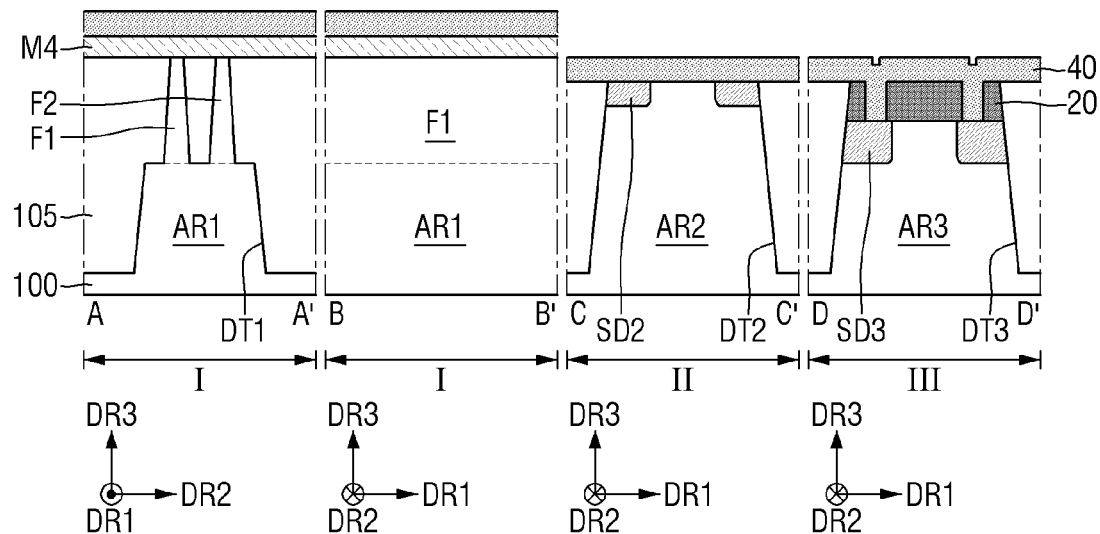

Referring to FIG. 13, a third insulating material layer 40 may be formed in the first to third regions I, II and III. For example, the third insulating material layer 40 may be conformally formed. For example, an upper surface of the third insulating material layer 40 formed in the second and third regions II and III may be formed at a same level as the upper surface of the first active pattern F1. The third insulating material layer 40 may include, for example, silicon oxide ($SiO_2$).

Figure 14:
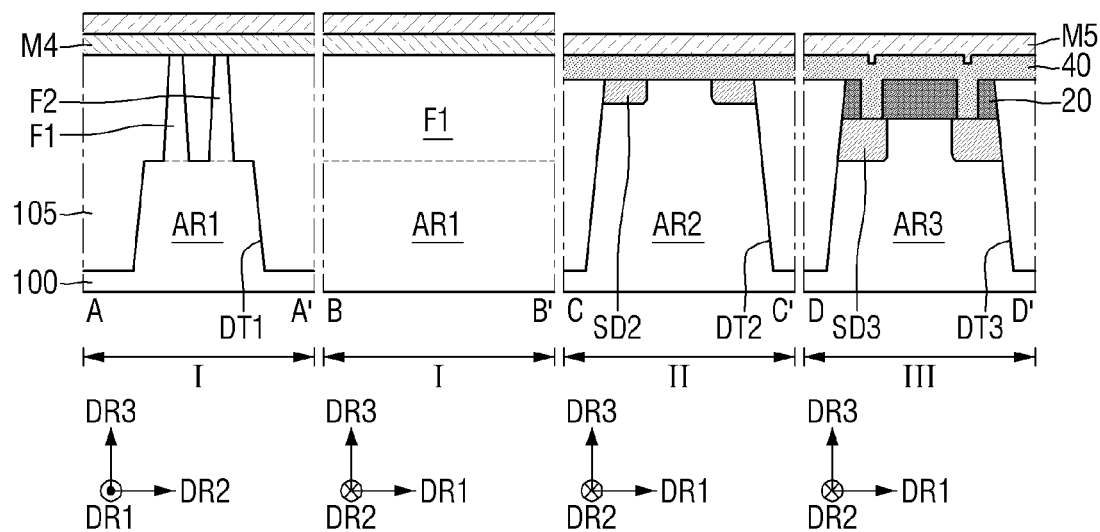

Referring to FIG. 14, the third insulating material layer 40 formed in the first region I may be removed. Subsequently, a fifth mask pattern M5 may be formed on the fourth mask pattern M4 in the first region I and the third insulating material layer 40 in the second and third regions II and III.

Figure 15:
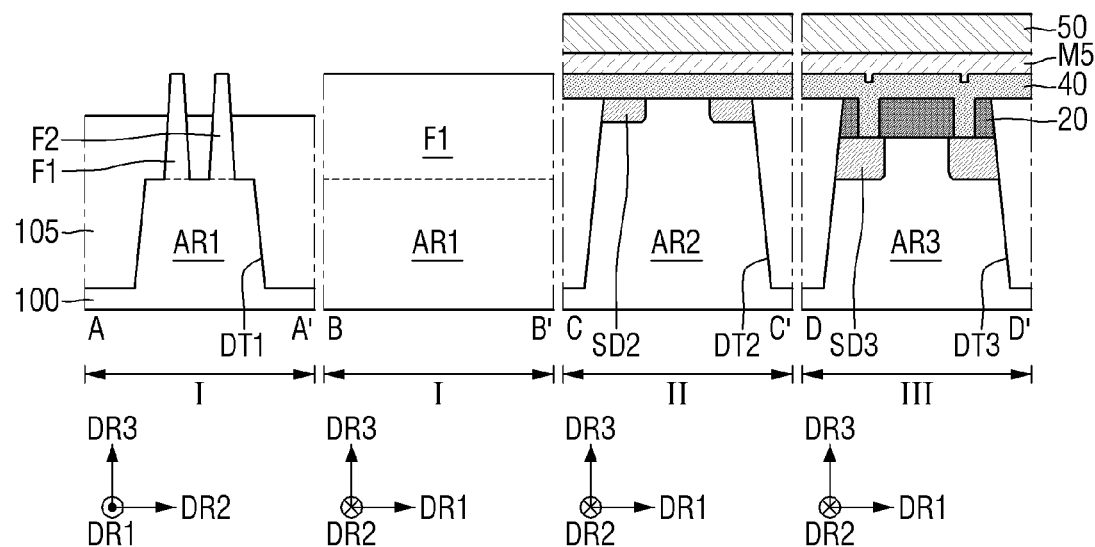

Referring to FIG. 15, a second protective layer 50 may be formed on the fifth mask pattern M5 in the second and third regions II and III. Subsequently, the fifth mask pattern M5 and the fourth mask pattern M4 in the first region I may be etched, using the second protective layer 50 as a mask. Further, a part of the field insulating layer 105 may be etched to expose an upper portion of each of the first and second active patterns F1 and F2.

Figure 16:
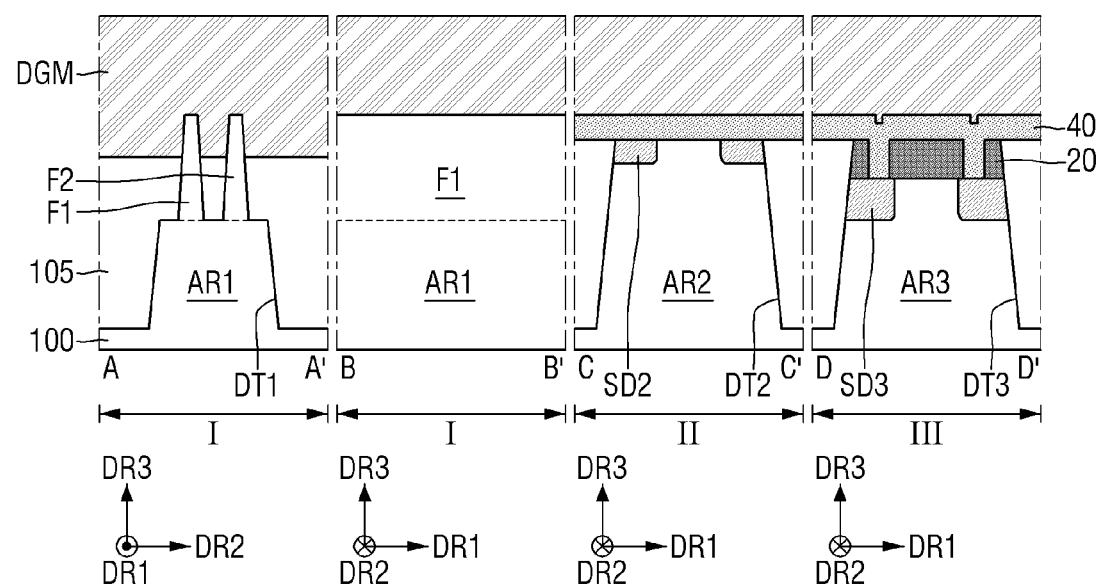

Referring to FIG. 16, the second protective layer 50 and the fifth mask pattern M5 in the second and third regions II and III may be removed. Subsequently, a dummy gate material layer DGM may be formed on the first and second active patterns F1 and F2 in the first region I, the field insulating layer 105 in the first region I, and the third insulating material layer 40 in the second and third regions II and III.

Figure 17:
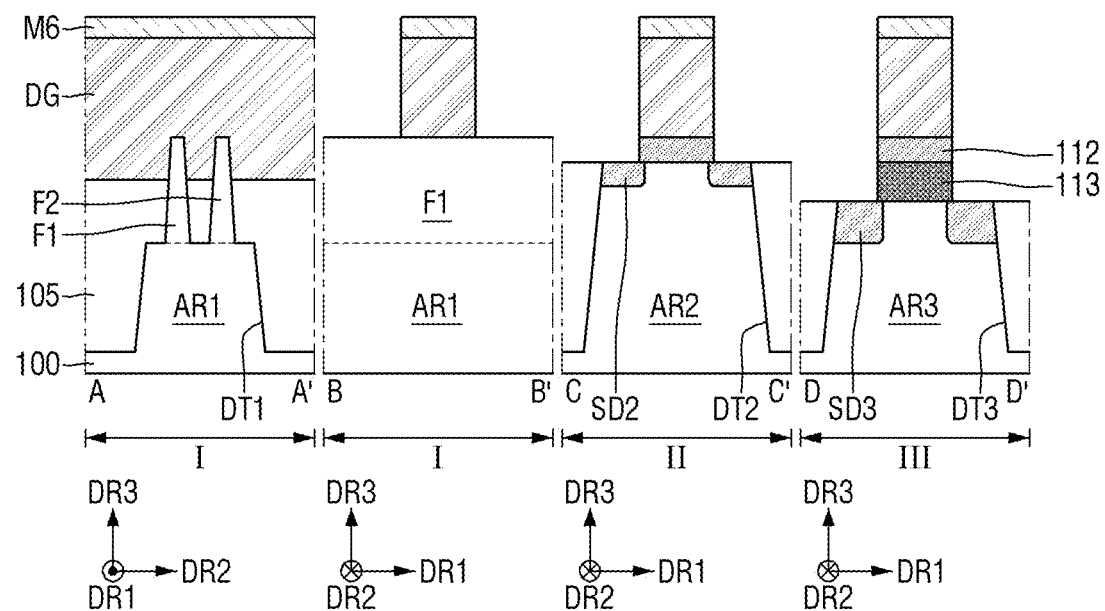

Referring to FIG. 17, a sixth mask pattern M6 may be formed on the dummy gate material layer DGM. Next, the dummy gate material layer DGM may be etched, using the sixth mask pattern M6 as a mask. Through this etching process, a plurality of dummy gates DG extending in the second horizontal direction DR2 may be formed in each of the first to third regions I, II and III.

The third insulating material layer 40 in the second region II may be etched while the plurality of dummy gates DG are formed. The remaining unetched third insulating material layer 40 may be defined as a second insulating layer 112. Further, the third insulating material layer 40 and the second insulating material layer 20 in the third region III may be etched while the plurality of dummy gates DG are formed. The unetched third insulating material layer 40 in the third region III may also be defined as a second insulating layer 112, and the unetched second insulating material layer 20 in the third region III may be defined as a third insulating layer 113.

Figure 18:
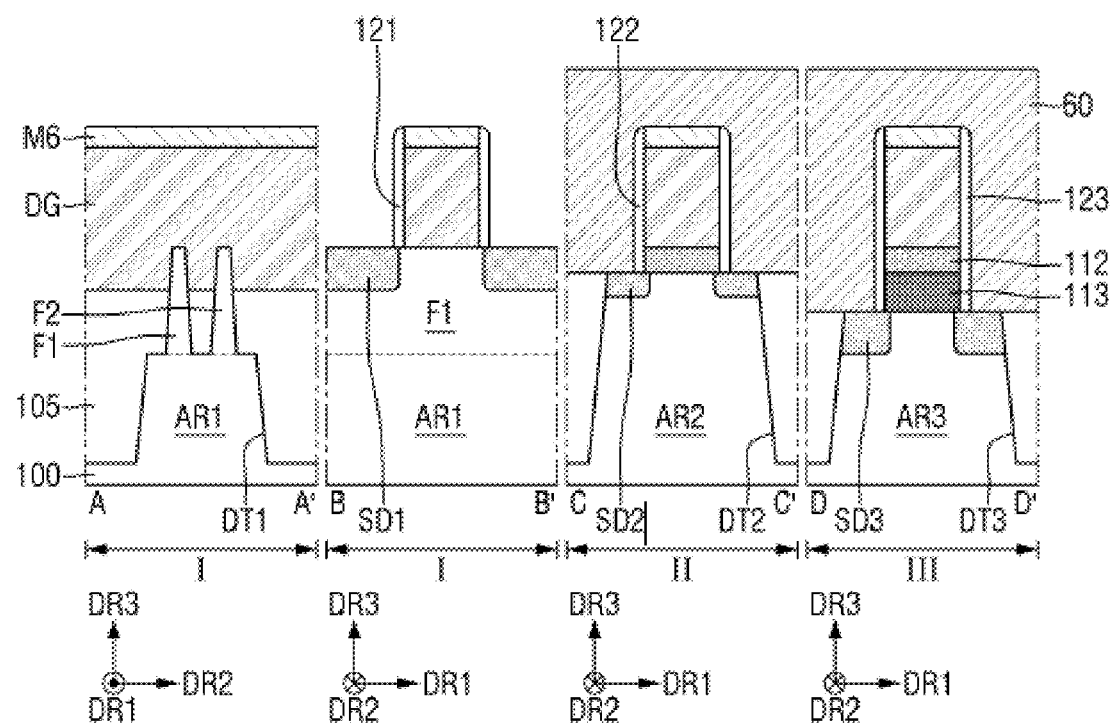

Referring to FIG. 18, a gate spacer may be formed on both side walls of the plurality of dummy gates DG in the first horizontal direction DR1. For example, a first gate spacer 121 may be formed on both side walls of the dummy gate DG in the first region I, a second gate spacer 122 may be formed on both side walls of the dummy gate DG in the second region II, and a third gate spacer 123 may be formed on both side walls of the dummy gate DG in the third region III.

The first gate spacer 121 may also be formed on side walls of the sixth mask pattern M6 in the first region I. The second gate spacer 122 may also be formed on each of side walls of the sixth mask pattern M6 in the second region II and side walls of the second insulating layer 112 in the second region II. The third gate spacer 123 may also be formed on side walls of the sixth mask pattern M6 in the third region III, side walls of the second insulating layer 112 in the third region III, and side walls of the third insulating layer 113 in the third region III.

Subsequently, a third protective layer 60 may be formed in the second and third regions II and III. Subsequently, a part of the first active pattern F1 may be etched, using the dummy gate DG and the first gate spacer 121 in the first region I as masks. Subsequently, the first source/drain region SD1 may be formed in the portion in which a part of the first active pattern F1 is etched.

Figure 19:
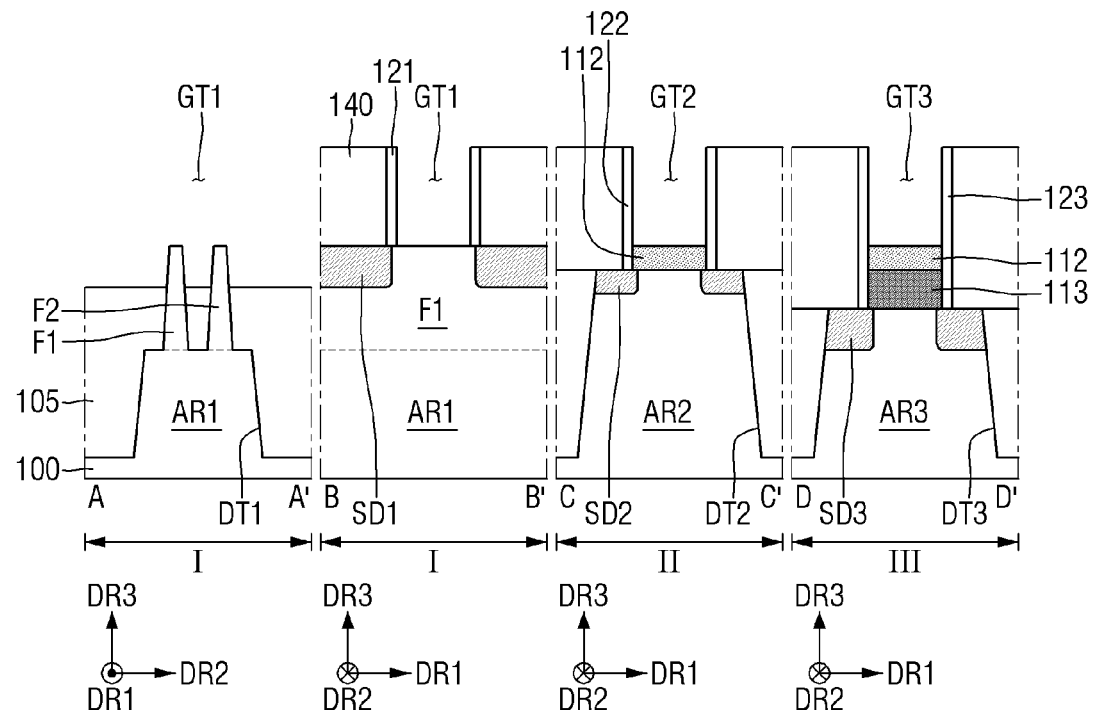

Referring to FIG. 19, the third protective layer 60 may be removed. Subsequently, a first interlayer insulating layer 140 may be formed on the first to third gate spacers 121, 122 and 123, the first to third source/drain regions SD1, SD2 and SD3, and the sixth mask pattern M6. Subsequently, a part of the first interlayer insulating layer 140 and the sixth mask pattern M6 may be etched through a flattening process to expose a plurality of dummy gates DG.

After that, the plurality of dummy gates DG may be removed to form first to third gate trenches GT1, GT2, and GT3. According to an embodiment, the first gate trench GT1 may be defined by the first gate spacer 121 on the first active pattern F1 in the first region I. The second gate trench GT2 may be defined by the second gate spacer 122 on the second insulating layer 112 in the second region II. The third gate trench GT3 may be defined by the third gate spacer 123 on the second insulating layer 112 in the third region III.

Figure 20:
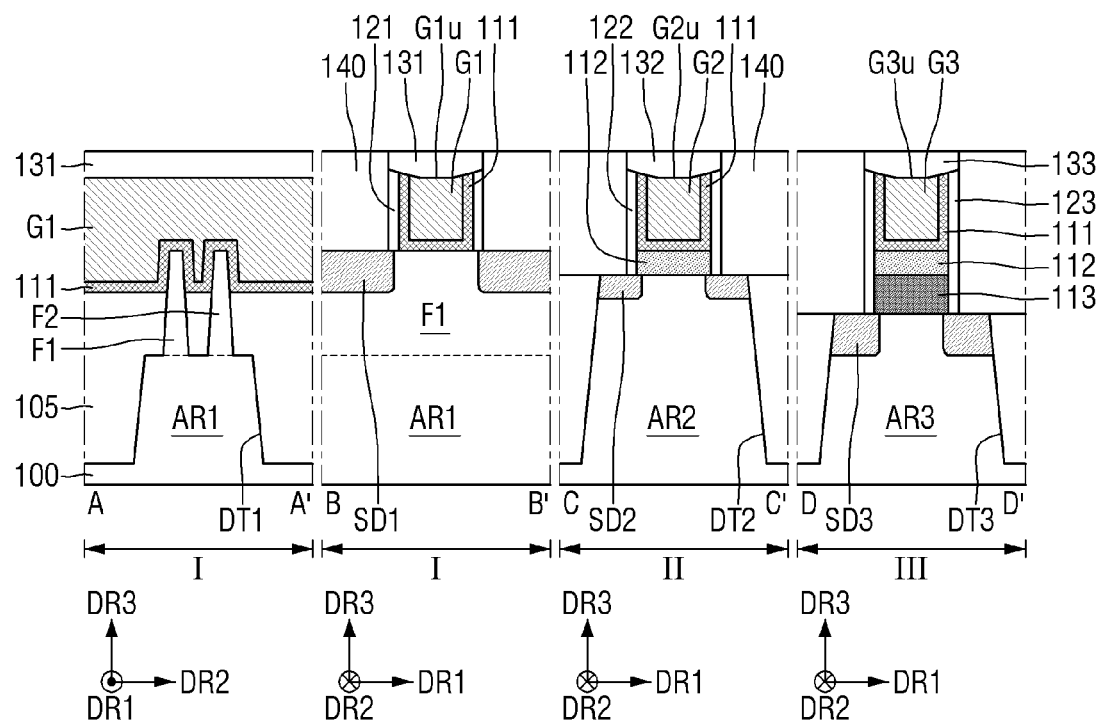

Referring to FIG. 20, a first insulating layer 111 may be formed on each of the first active pattern F1, the second insulating layer 112 on the second active region AR2, and the second insulating layer 112 on the third active region AR3.

For example, the first insulating layer 111 may be formed along side walls and a bottom surface of the first gate trench (GT1 of FIG. 19) in the first region I. The first insulating layer 111 may be formed along side walls and a bottom surface of the second gate trench (GT2 of FIG. 19) in the second region II. The first insulating layer 111 may be formed along side walls and a bottom surface of the third gate trench (GT3 of FIG. 19) in the third region III.

Subsequently, a gate electrode may be formed on the first insulating layer 111. For example, a first gate electrode G1 may be formed on the first insulating layer 111 in the first region I. A second gate electrode G2 may be formed on the first insulating layer 111 in the second region II. A third gate electrode G3 may be formed on the first insulating layer 111 in the third region III. Each of the first to third gate electrodes G1, G2, and G3 may extend in the second horizontal direction DR2.

Subsequently, a first capping pattern 131 may be formed on the first gate electrode G1, the first insulating layer 111, and the first gate spacer 121. A second capping pattern 132 may be formed on the second gate electrode G2, the first insulating layer 111, and the second gate spacer 122. A third capping pattern 133 may be formed on the third gate electrode G3, the first insulating layer 111, and the third gate spacer 123.

Thicknesses of each of the first to third gate electrodes G1, G2, and G3 in the vertical direction DR3 may be formed to be equal to one another. For example, a first thickness (t1 of FIG. 2) in the vertical direction DR3 of the first gate electrode G1 that overlaps the first active pattern F1 in the vertical direction DR3, a second thickness (t2 of FIG. 2) in the vertical direction DR3 of the second gate electrode G2 that overlaps the second active region AR2 in the vertical direction DR3, and a third thickness (t3 of FIG. 2) in the vertical direction DR3 of the third gate electrode G3 that overlaps the third active region AR3 in the vertical direction DR3 may be formed to be equal to one another.

The upper surfaces of each of the first to third gate electrodes G1, G2, and G3 may be formed at a same level on the substrate 100. For example, an upper surface G1u of the first gate electrode G1 that is in contact with the lowermost surface of the first capping pattern 131, an upper surface G2u of the second gate electrode G2 that is in contact with the lowermost surface of the second capping pattern 132, and an upper surface G3u of the third gate electrode G3 that is in contact with the lowermost surface of the third capping pattern 133 may be formed at a same level on the substrate 100.

Subsequently, an etching stop layer 150 and a second interlayer insulating layer 160 may be sequentially formed on the first interlayer insulating layer 140 and each of the first to third capping patterns 131, 132 and 133, as shown in FIG. 2.

The semiconductor device and the method for manufacturing a semiconductor device according to the above embodiments may enable a low voltage transistor, an intermediate voltage transistor, and a high voltage transistor formed on a same substrate to have respective gate electrodes having a same thickness and respective gate insulating layers having different thicknesses, thereby to be formed at a same level on the substrate.

Hereinafter, a method for manufacturing a semiconductor device according to other embodiments will be described referring to FIGS. 21 to 27. Differences from the method for manufacturing the semiconductor device shown in FIGS. 3 to 20 will be described herebelow, and duplicate descriptions will be omitted.

FIGS. 21 to 27 are intermediate stage diagrams for explaining a method for manufacturing a semiconductor device according to other embodiments.

Figure 21:
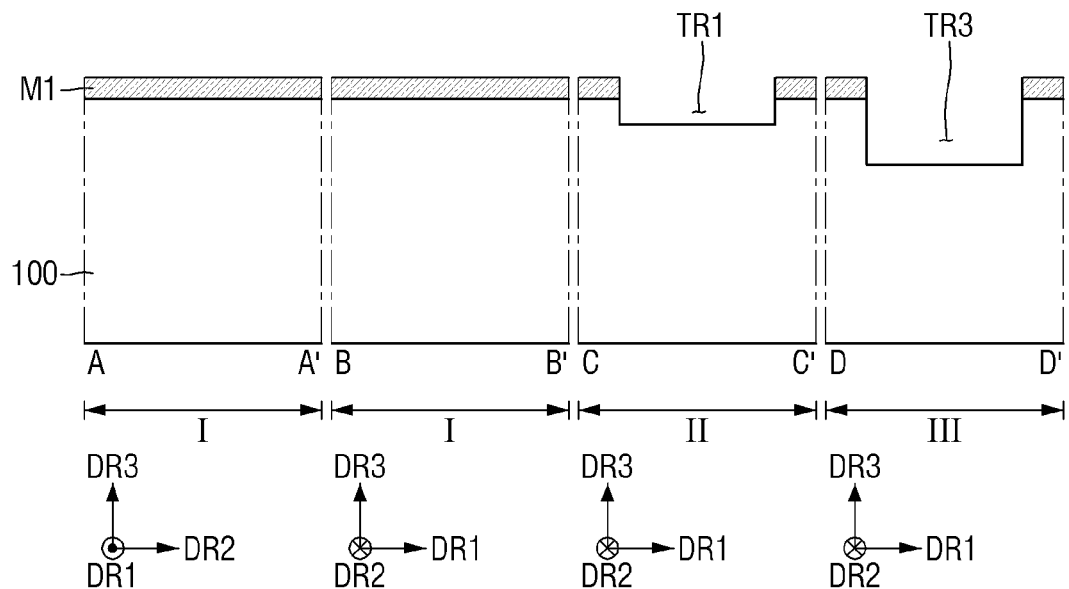
FIGS. 21 to 27 are intermediate stage diagrams for explaining a method for fabricating a semiconductor device, according to embodiments.

Referring to FIG. 21, a substrate 100 is provided in which first to third regions I, II and III are defined. Subsequently, a first mask pattern M1 may be formed on an upper surface of the substrate 100. Subsequently, the upper surface of the substrate 100 at the second region II may be etched using the first mask pattern M1 as a mask to form a first trench TR1. Further, the upper surface of the substrate 100 at the third region III may be etched using the first mask pattern M1 as a mask to form a third trench TR3. The third trench TR3 may be formed to be deeper than the first trench TR1. That is, a lower surface of the third trench TR3 may be formed at a level lower than a lower surface of the first trench TR1.

Figure 22:
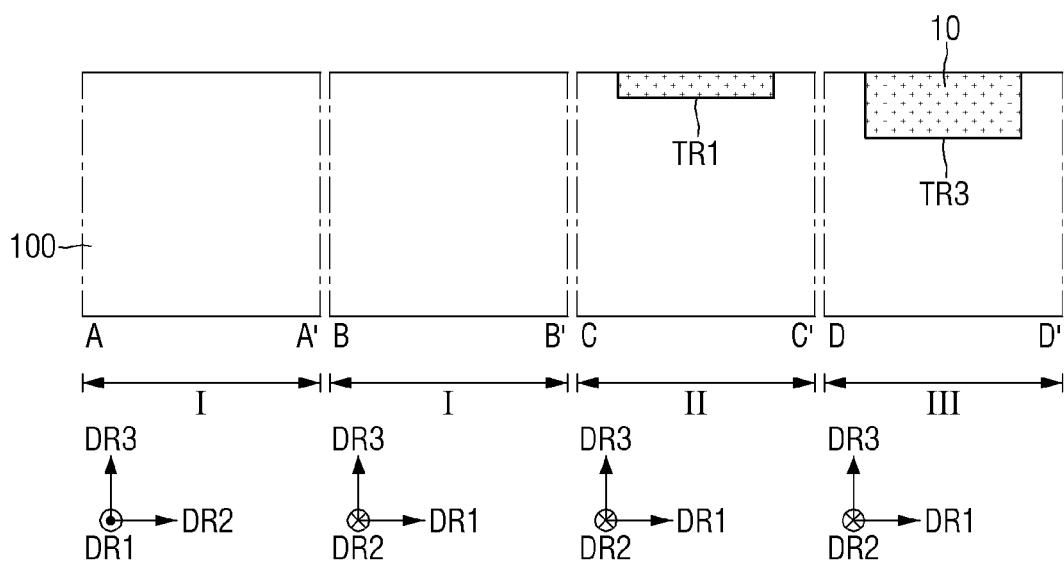

Referring to FIG. 22, a first insulating material layer 10 may be formed inside each of the first trench TR1 and the third trench TR3. After that, the first mask pattern M1 may be removed through a flattening process.

Figure 23:
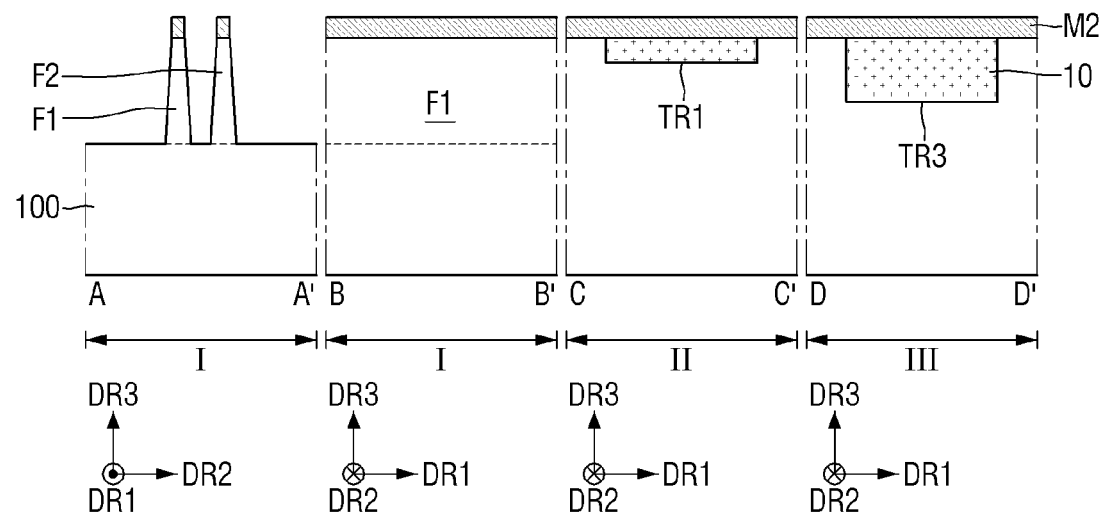

Referring to FIG. 23, a second mask pattern M2 may be formed on the upper surface of the substrate 100 and the first insulating material layer 10. Subsequently, a part of the substrate 100 at the first region I may be etched using the second mask pattern M2 as a mask to form first and second active patterns F1 and F2 extending in the first horizontal direction DR1.

Figure 24:
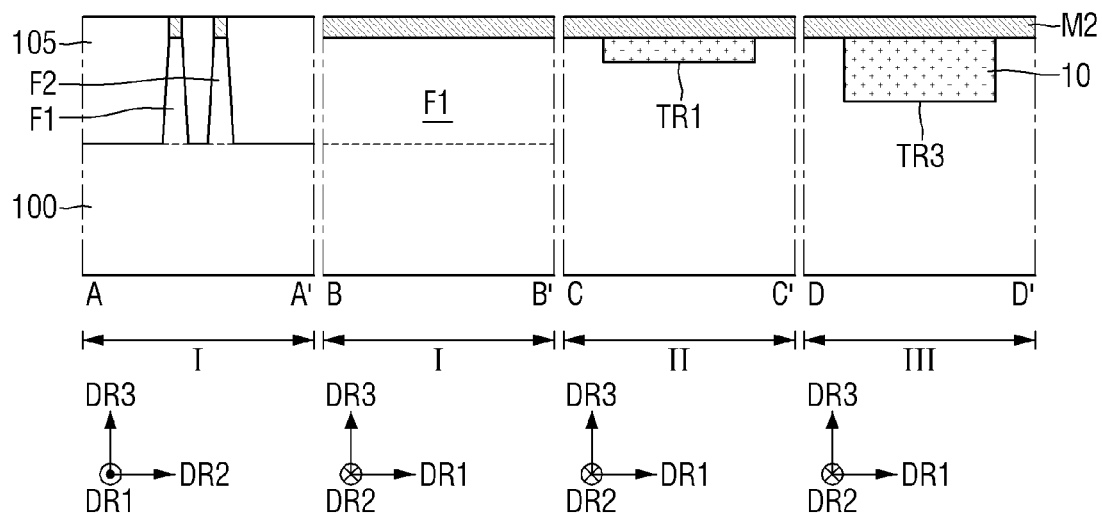

Referring to FIG. 24, a field insulating layer 105 may be formed to surround side walls of each of the first and second active patterns F1 and F2 and side walls of the second mask pattern M2. For example, an upper surface of the field insulating layer 105 may be formed on a same plane as an upper surface of the second mask pattern M2.

Figure 25:
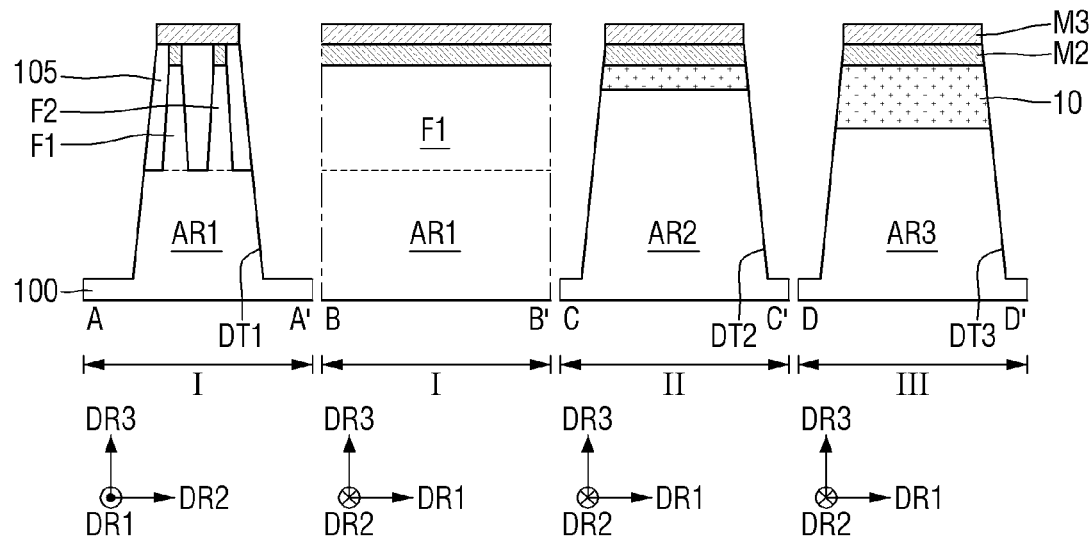

Referring to FIG. 25, a third mask pattern M3 may be formed on the field insulating layer 105 and the second mask pattern M2. Subsequently, a part of the second mask pattern M2, a part of the first insulating material layer 10, a part of the field insulating layer 105, and a part of the substrate 100 may be etched, using the third mask pattern M3 as a mask. Through this etching process, a first deep trench DT1 may be formed on the substrate 100 at the first region I, a second deep trench DT2 is formed on the substrate 100 at the second region II, and a third deep trench DT3 may be formed on the substrate 100 at the third region III.

Figure 26:
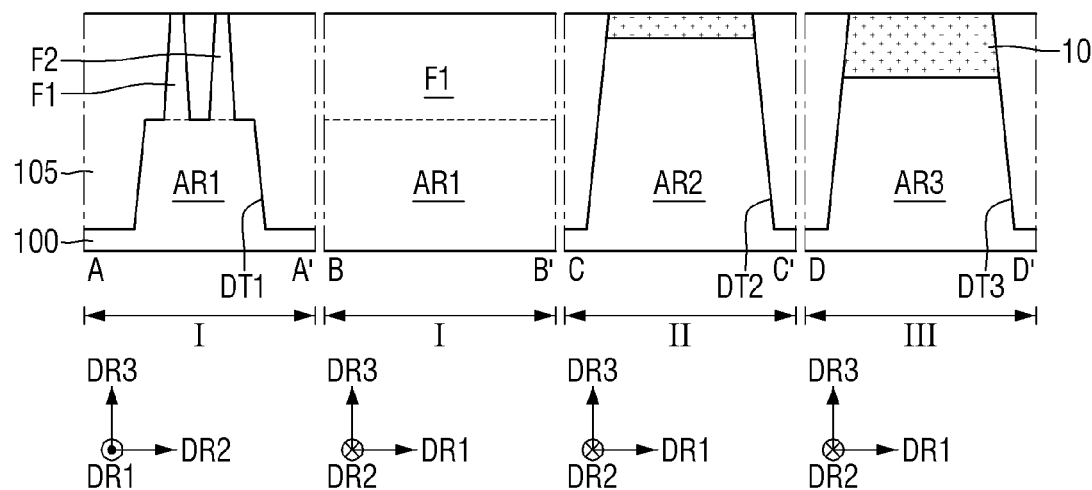

Referring to FIG. 26, the field insulating layer 105 may also be formed inside each of the first to third deep trenches DT1, DR2, and DR3. Subsequently, the third mask pattern M3 and the second mask pattern M2 may be removed through a flattening process.

Figure 27:
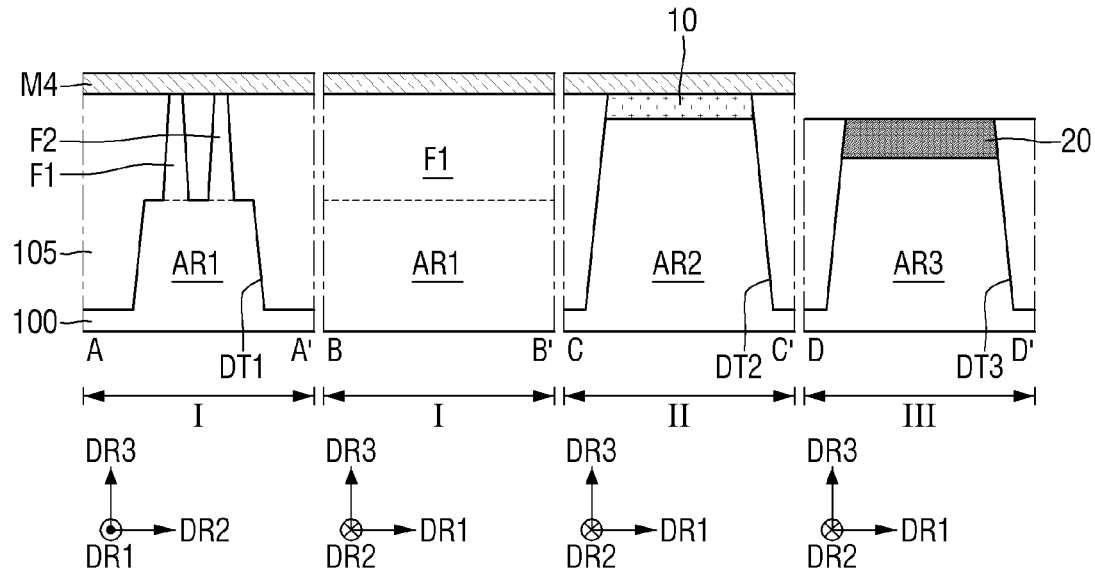

Referring to FIG. 27, a fourth mask pattern M4 may be formed in the first region I and the second region II. Subsequently, a part of the field insulating layer 105 and a part of the first insulating material layer 10 formed in the third region III may be etched, using the fourth mask pattern M4 as a mask. The remaining unetched first insulating material layer 10 in the third region III may be defined as the second insulating material layer 20. For example, an upper surface of the second insulating material layer 20 in the third region III may be formed at a same level as an upper surface of the second active region AR2 in the second region II.

Subsequently, after performing the manufacturing processes shown in FIGS. 11 to 20, an etching stop layer 150 and a second interlayer insulating layer 160 may be sequentially formed on the first interlayer insulating layer 140 and each of first to third capping patterns 131, 132 and 133. The semiconductor device shown in FIG. 2 may be manufactured through the foregoing method.

Hereinafter, a semiconductor device according to other embodiments will be described referring to FIG. 28. Differences from the semiconductor device shown in FIGS. 1 and 2 will be described herebelow, and duplicate descriptions will be omitted.

Figure 28:
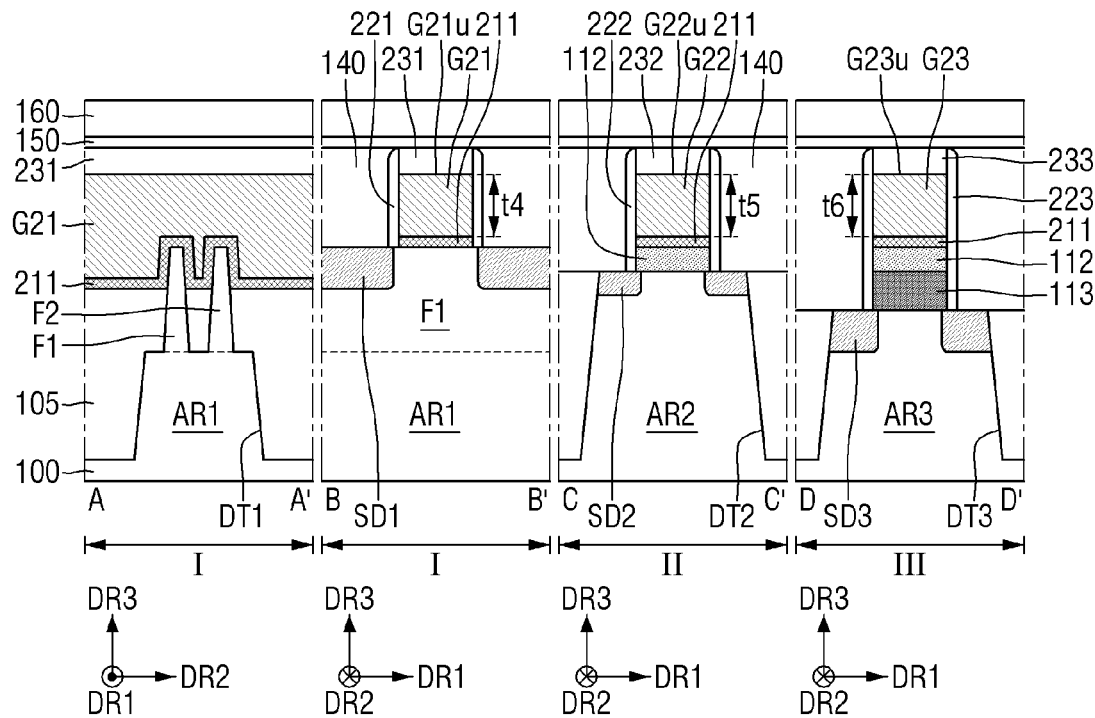
FIG. 28 is a cross-sectional view for explaining a semiconductor device, according to embodiments.

FIG. 28 is a cross-sectional view for explaining a semiconductor device, according to other embodiments.

Referring to FIG. 28, in a semiconductor device according to other embodiments, a first insulating layer 211 may be formed on a bottom surfaces of each of first to third gate electrodes G21, G22, and G23. According to an embodiment, side walls of the first gate electrode G21 may be in contact with the first gate spacer 221. Side walls of the second gate electrode G22 may be in contact with a second gate spacer 222. Side walls of the third gate electrode G23 may be in contact with a third gate spacer 223.

A first capping pattern 231 may be disposed on the first gate electrode G21, a second capping pattern 232 may be disposed on the second gate electrode G22, and a third capping pattern 233 may be disposed on the third gate electrode G23. The first capping pattern 231 is disposed between the first gate spacers 221, the second capping pattern 232 is disposed between the second gate spacers 222, and the third capping patterns 233 may be disposed between the third gate spacers 223.

Thicknesses of the first to third gate electrodes G21, G22, and G23 in the vertical direction DR3 may be equal to one another. For example, a fourth thickness t4 in the vertical direction DR3 of the first gate electrode G21 that overlaps a first active pattern F1 in the vertical direction DR3, a fifth thickness t5 in the vertical direction DR3 of the second gate electrode G22 that overlaps a second active region AR2 in the vertical direction DR3, and a sixth thickness t6 in the vertical direction DR3 of the third gate electrode G23 that overlaps a third active region AR3 in the vertical direction DR3 may be equal to one another.

Upper surfaces of the first to third gate electrodes G21, G22, and G23 may be formed at a same level on a substrate 100. For example, an upper surface G21u of the first gate electrode G21 that is in contact with the lowermost surface of the first capping pattern 231, an upper surface G22u of the second gate electrode G22 that is in contact with the lowermost surface of the second capping pattern 232, and an upper surface G23u of the third gate electrode G23 that is in contact with the lowermost surface of the third capping pattern 233 may be formed at a same level on the substrate 100.

Hereinafter, a method for manufacturing a semiconductor device according to other embodiments will be described referring to FIGS. 28 to 32. Differences from the method for fabricating the semiconductor device shown in FIGS. 3 to 20 will be described, and duplicate descriptions will be omitted.

FIGS. 29 to 32 are intermediate stage diagrams for explaining a method for manufacturing a semiconductor device, according to other embodiments.

Figure 29:
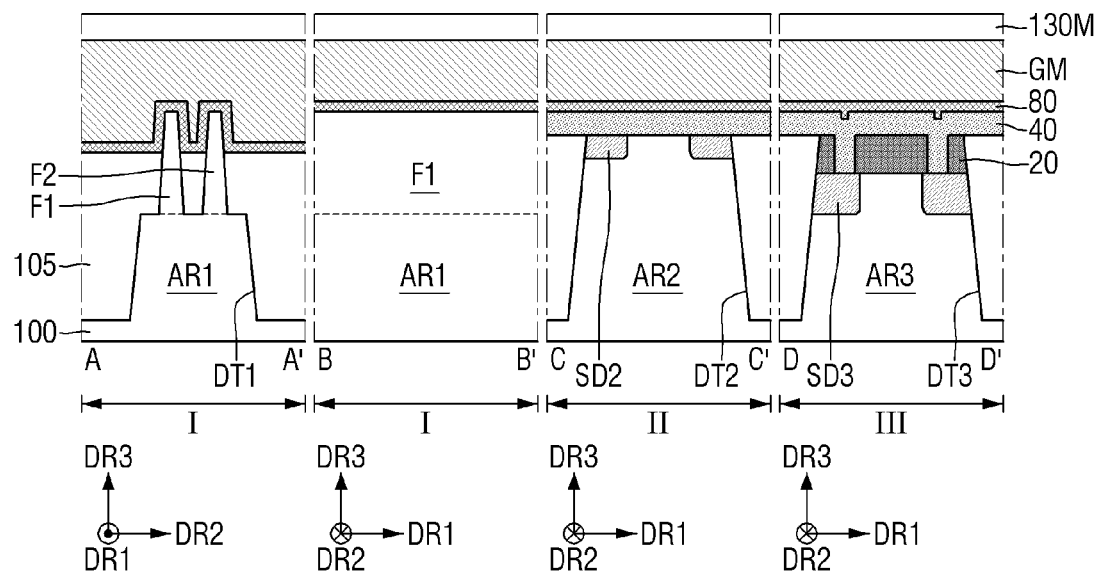
FIGS. 29 to 32 are intermediate stage diagrams for explaining a method for fabricating a semiconductor device, according to embodiments.

Referring to FIG. 29, after performing the manufacturing processes shown in FIGS. 3 to 15, a second protective layer (50 of FIG. 15) and a fifth mask pattern (M5 of FIG. 15) in second and third regions II and III may be removed. Subsequently, a fourth insulating material layer 80 may be formed on first and second active patterns F1 and F2 in a first region I, a field insulating layer 105 in the first region I, and a third insulating material layer 40 in the second and third regions II and III. For example, the fourth insulating material layer 80 may be conformally formed.

Subsequently, a gate material layer GM may be formed on the fourth insulating material layer 80 in the first to third regions I, II and III. Upper surface of the gate material layer GM may be formed flat through a flattening process. Next, a capping material layer 130M may be formed on the gate material layer GM in the first to third regions I, II and III. For example, the capping material layer 130M may be conformally formed.

Figure 30:
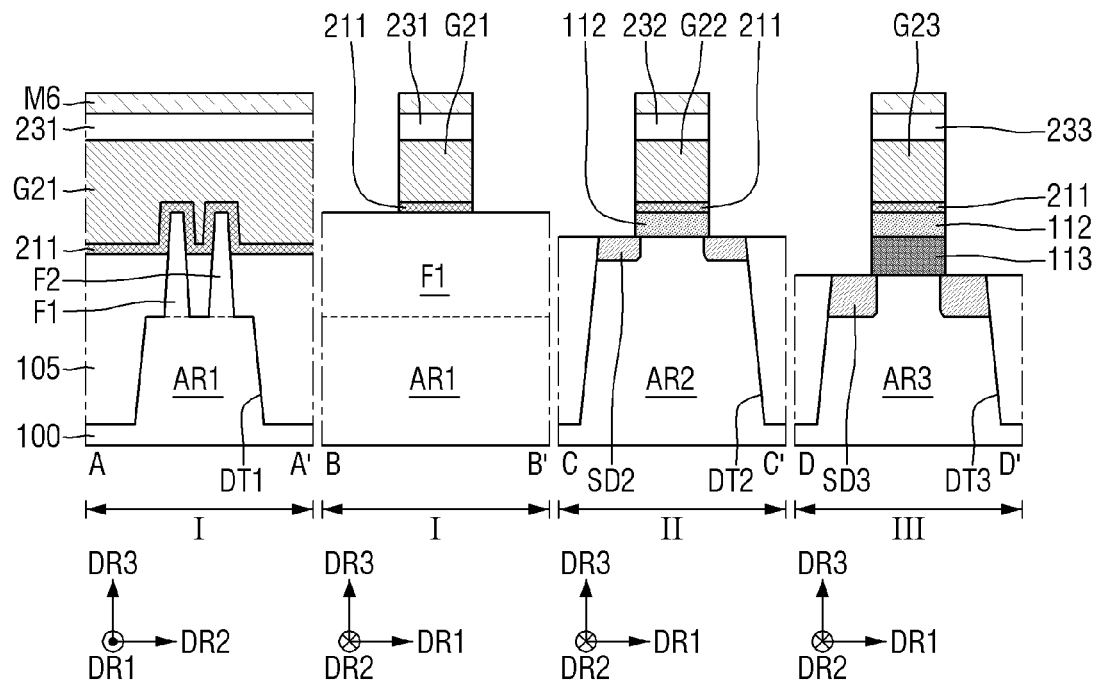

Referring to FIG. 30, through a patterning process, the fourth insulating material layer 80 is etched to form a first insulating layer 211, and the gate material layer GM may be etched to form first to third gate electrodes G21, G22 and G23.

Specifically, a sixth mask pattern M6 may be formed on the capping material layer 130M. Next, the capping material layer 130M, the gate material layer GM, the fourth insulating material layer 80, the third insulating material layer 40, and a second insulating material layer 20 may be etched using the sixth mask pattern M6 as a mask.

For example, in the first region I, by utilizing the sixth mask pattern M6 as a mask, the capping material layer 130M may be etched to form a first capping pattern 231, the gate material layer GM may be etched to form the first gate electrode G21, and the fourth insulating material layer 80 may be etched to form the first insulating layer 211.

Further, in the second region II, by utilizing the sixth mask pattern M6 as a mask, the capping material layer 130M may be etched to form a second capping pattern 232, the gate material layer GM may be etched to form the second gate electrode G22, the fourth insulating material layer 80 may be etched to form the first insulating layer 211, and the third insulating material layer 40 may be etched to form a second insulating layer 112.

Further, in the third region III, by utilizing the sixth mask pattern M6 as a mask, the capping material layer 130M may be etched to form a third capping pattern 233, the gate material layer GM may be etched to form the third gate electrode G23, the fourth insulating material layer 80 may be etched to form the first insulating layer 211, the third insulating material layer 40 may be etched to form the second insulating layer 112, and the second insulating material layer 20 may be etched to form a third insulating layer 113.

Figure 31:
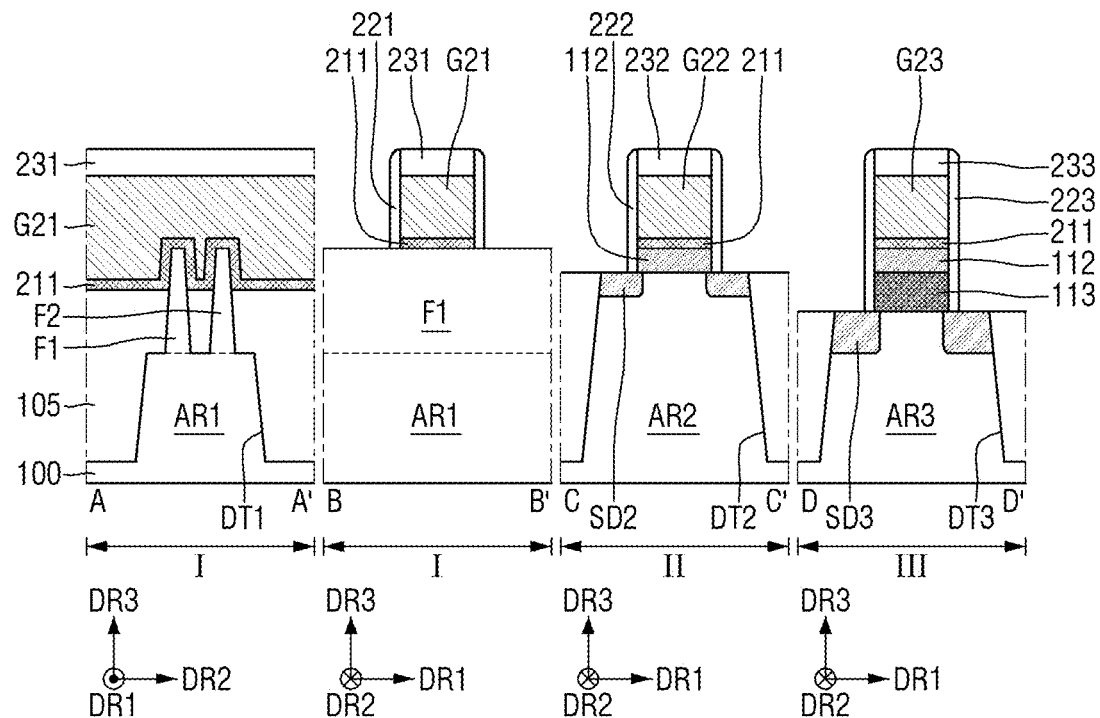

Referring to FIG. 31, the sixth mask pattern M6 may be removed. Subsequently, in the first region I, a first gate spacer 221 may be formed on both side walls of each of the first capping pattern 231, the first gate electrode G21 and the first insulating layer 211 in the first horizontal direction DR1.

Further, in the second region II, a second gate spacer 222 may be formed on both side walls of each of the second capping pattern 232, the second gate electrode G22, the first insulating layer 211, and the second insulating layer 112 in the first horizontal direction DR1. Further, in the third region III, a third gate spacer 223 may be formed on both side walls of each of the third capping pattern 233, the third gate electrode G23, the first insulating layer 211, the second insulating layer 112, and the third insulating layer 113 in the first horizontal direction DR1.

Figure 32:
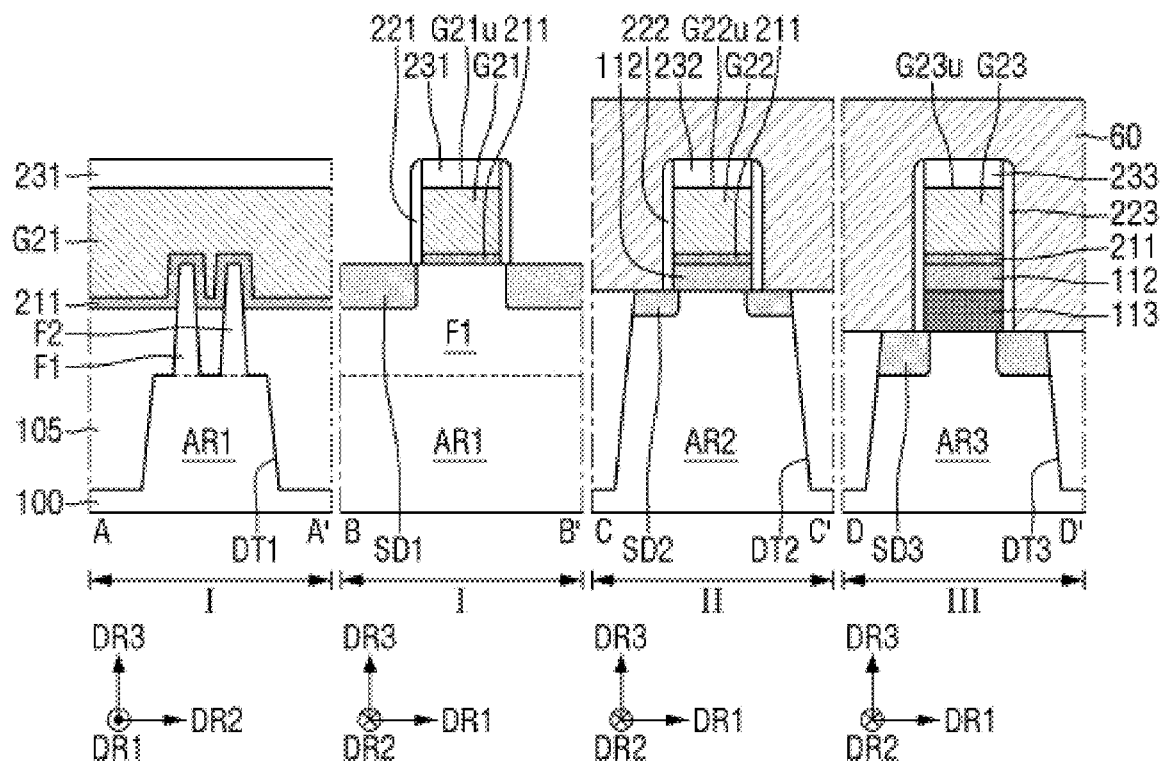

Referring to FIG. 32, a third protective layer 60 may be formed in the second and third regions II and III. Subsequently, a part of the first active pattern F1 may be etched, using the first capping pattern 231 and the first gate spacer 221 in the first region I as masks. Subsequently, a first source/drain region SD1 may be formed where a part of the first active pattern F1 is etched.

Referring to FIG. 28, the third protective layer 60 may be removed. Subsequently, the first to third gate spacers 221 and 222, 223, the first to third source/drain regions SD1, SD2 and SD3, and the first interlayer insulating layer 140 may be formed. Subsequently, a part of the first interlayer insulating layer 140 may be etched through a flattening process to expose the first to third capping patterns 231, 232 and 233.

Subsequently, the etching stop layer 150 and the second interlayer insulating layer 160 may be sequentially formed on the first interlayer insulating layer 140 and each of the first to third capping patterns 231, 232, and 233. The semiconductor device shown in FIG. 28 may be manufactured through the foregoing method.

Hereinafter, a semiconductor device according to other embodiments will be described referring to FIG. 33. Differences from the semiconductor device shown in FIGS. 1 and 2 will be described, and duplicate descriptions will be omitted.

Figure 33:
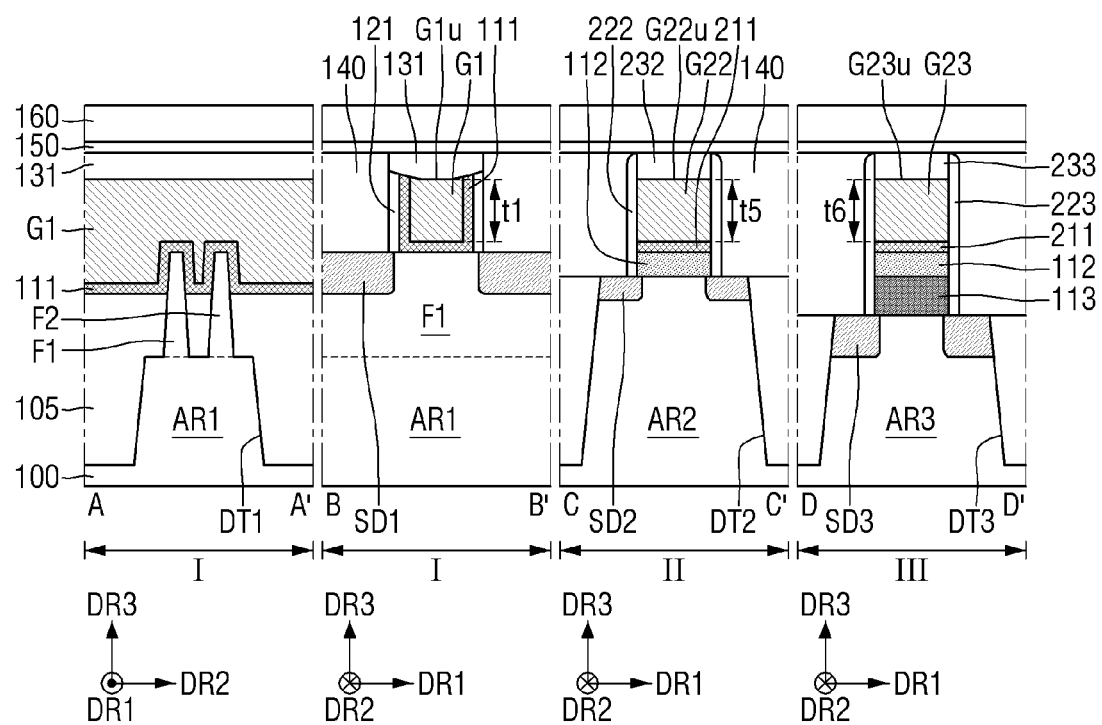
FIG. 33 is a cross-sectional view for explaining a semiconductor device, according to embodiments.

FIG. 33 is a cross-sectional view for explaining a semiconductor device according to some other embodiments.

Referring to FIG. 33, in a semiconductor device according to other embodiments, a first insulating layer 111 may be disposed along side walls and a bottom surface of a first gate electrode G1 in the first region I. Further, a first insulating layer 211 may be formed on a bottom surface of a second gate electrode G22 in the second region II. Further, a first insulating layer 211 may be formed on a bottom surface of a third gate electrode G23 in the third region III. According to an embodiment, side walls of the second gate electrode G22 may be in contact with the second gate spacer 222, and side walls of the third gate electrode G23 may be in contact with a third gate spacer 223.

A second capping pattern 232 may be disposed on the second gate electrode G22, and a third capping pattern 233 may be disposed on the third gate electrode G23. The second capping pattern 232 may be disposed between the second gate spacers 222, and the third capping pattern 233 may be disposed between the third gate spacers 223.

Thicknesses of the first to third gate electrodes G1, G22, and G23 in the vertical direction DR3 may be equal to one another. For example, a first thickness t1 in the vertical direction DR3 of the first gate electrode G1 that overlaps a first active pattern F1 in the vertical direction DR3, a fifth thickness t5 in the vertical direction DR3 of the second gate electrode G22 that overlaps a second active region AR2 in the vertical direction DR3, and a sixth thickness t6 in the vertical direction DR3 of the third gate electrode G23 that overlaps a third active region AR3 in the vertical direction DR3 may be equal to one another.

Upper surfaces of the first to third gate electrodes G1, G22, and G23 may be formed at a same level on a substrate 100. For example, an upper surface G1u of the first gate electrode G1 that is in contact with a bottom surface of a first capping pattern 131, an upper surface G22u of the second gate electrode G22 that is in contact with a bottom surface of a second capping pattern 232, and an upper surface G23u of the third gate electrode G23 that is in contact with a bottom surface of a third capping pattern 233 may be formed at a same level on a substrate 100.

In concluding the detailed description, those skilled in the art will appreciate that many variations and modifications may be made to the above embodiments without substantially departing from the principles. Therefore, the embodiments of the disclosure are used in a generic and descriptive sense only and not for purposes of limitation.

What is claimed is:

1. A semiconductor device comprising:
a substrate comprising first and second regions thereon;
a first active region in the first region;
an active pattern on the first active region;
a second active region in the second region;
a third region on the substrate;
a third active region in the third region;
a first gate electrode on the active pattern;
a second gate electrode on the second active region;
a third gate electrode in the third active region;
a first gate insulating layer, comprising a first-first insulating layer, between the active pattern and the first gate electrode;
a second gate insulating layer, comprising a second-first insulating layer and a second-second insulating layer below the second-first insulating layer, between the second active region and the second gate electrode; and
a third gate insulating layer, comprising a third-first insulating layer, a third-second insulating layer below the third-first insulating layer, and a third-third insulating layer below the third-second insulating layer, between the third active region and the third gate electrode,
wherein a thickness in a vertical direction of the first gate electrode that overlaps the active pattern in the vertical direction is equal to a thickness in the vertical direction of the second gate electrode that overlaps the second active region in the vertical direction, wherein an upper surface of the first gate electrode is formed at a same level as an upper surface of the second gate electrode, and wherein a thickness in the vertical direction of the third gate electrode that overlaps the third active region in the vertical direction is equal to the thickness in the vertical direction of the first gate electrode that overlaps the active pattern in the vertical direction.

2. The semiconductor device of claim 1, wherein an upper surface of the second active region is at a level between an upper surface of the first active region and an upper surface of the active pattern.

3. The semiconductor device of claim 1, wherein the first-first insulating layer is on side walls and a bottom surface of the first gate electrode.

4. The semiconductor device of claim 3, wherein the second-first insulating layer is on side walls and a bottom surface of the second gate electrode.

5. The semiconductor device of claim 1, further comprising:
a first gate spacer on side walls of the first gate electrode; and
a second gate spacer on side walls of the second gate electrode,
wherein the first-first gate insulating layer is between the first gate spacers, and the second-first gate insulating layer is between the second gate spacers.

6. The semiconductor device of claim 5, wherein the side walls of the first gate electrode are in contact with the first gate spacer, and
wherein the side walls of the second gate electrode are in contact with the second gate spacer.

7. The semiconductor device of claim 1, wherein an upper surface of the third gate electrode is formed at a same level as the upper surface of the first gate electrode.

8. A semiconductor device comprising:
a substrate comprising first to third regions thereon;
a first active region in the first region;
an active pattern on the first active region;
a second active region in the second region;
a third active region in the third region;
a first gate electrode on the active pattern;
a second gate electrode on the second active region;
a third gate electrode on the third active region;
a first gate insulating layer, comprising a first-first insulating layer, between the active pattern and the first gate electrode;
a second gate insulating layer, comprising a second-first insulating layer and a second-second insulating layer below the second-first insulating layer, between the second active region and the second gate electrode; and
a third gate insulating layer, comprising a third-first insulating layer, a third-second insulating layer below the third-first insulating layer, and a third-third insulating layer below the third-second insulating layer, between the third active region and the third gate electrode,
wherein a thickness in a vertical direction of the first gate electrode that overlaps the active pattern in the vertical direction, a thickness in the vertical direction of the second gate electrode that overlaps the second active region in the vertical direction, and a thickness in the vertical direction of the third gate electrode that overlaps the third active region in the vertical direction are equal to one another, and
wherein an upper surface of the first gate electrode, an upper surface of the second gate electrode, and an upper surface of the third gate electrode are formed at a same level on the substrate.

9. The semiconductor device of claim 8, wherein a thickness of the third-third insulating layer in the vertical direction is greater than a thickness of the third-second insulating layer in the vertical direction, and
wherein the thickness of the third-second insulating layer in the vertical direction is greater than a thickness of the third-first insulating layer.

10. The semiconductor device of claim 8, wherein an upper surface of the second active region is formed at a level lower than an upper surface of the active pattern, and
wherein an upper surface of the third active region is formed at a level lower than the upper surface of the second active region.

11. The semiconductor device of claim 8, further comprising:
a first source/drain region disposed on at least one side of the first gate electrode;
a second source/drain region disposed on at least one side of the second gate electrode; and
a third source/drain region disposed on at least one side of the third gate electrode,
wherein an upper surface of the second source/drain region is formed at a level lower than an upper surface of the first source/drain region, and
wherein an upper surface of the third source/drain region is formed at a level lower than the upper surface of the second source/drain region.

12. The semiconductor device of claim 11, wherein a thickness of the third source/drain region in the vertical direction is greater than a thickness of the second source/drain region in the vertical direction.

13. A semiconductor device comprising:
a first active region;
a first gate electrode on the first active region;
a first gate insulating layer comprising a first insulating layer and a second insulating layer below the first insulating layer, between the first active region and the first gate electrode;
a second active region;
a second gate electrode on the second active region; and
a second gate insulating layer comprising a third insulating layer, a fourth insulating layer below the third insulating layer, and a fifth insulating layer below the fourth insulating layer, between the second active region and the second gate electrode,
wherein a thickness in a vertical direction of the first gate electrode that overlaps the first active region in the vertical direction is equal to a thickness in the vertical direction of the second gate electrode that overlaps the second active region in the vertical direction,
wherein an upper surface of the first gate electrode is at a same level as an upper surface of the second gate electrode in the vertical direction,
wherein the second insulating layer is not disposed at a lateral side of the first gate electrode,
wherein the fourth insulating layer and the fifth insulating layer are not disposed at a lateral side of the second gate electrode,
wherein a thickness of the fifth insulating layer is greater than a thickness of the fourth insulating layer, and
wherein the thickness of the fourth insulating layer is greater than a thickness of the third insulating layer.

14. The semiconductor device of claim 13, wherein the thickness of the third insulating layer is equal to a thickness of the first insulating layer, and wherein the thickness of the fourth insulating layer is equal to a thickness of the second insulating layer.

15. The semiconductor device of claim 13, wherein an upper surface of the second active region is formed at a level lower than an upper surface of the first active region.

16. The semiconductor device of claim 13, further comprising:
   a first source/drain region disposed on at least one side of the first gate electrode; and
   a second source/drain region disposed on at least one side of the second gate electrode,
   wherein an upper surface of the second source/drain region is formed at a level lower than an upper surface of the first source/drain region.

17. The semiconductor device of claim 16, wherein a thickness of the second source/drain region is greater than a thickness of the first source/drain region.

* * * * *